US011355353B2

United States Patent
Yu et al.

(10) Patent No.: US 11,355,353 B2
(45) Date of Patent: Jun. 7, 2022

(54) TIN OXIDE MANDRELS IN PATTERNING

(71) Applicant: Lam Research Corporation, Fremont, CA (US)

(72) Inventors: Jengyi Yu, San Ramon, CA (US); Samantha SiamHwa Tan, Fremont, CA (US); Seongjun Heo, Dublin, CA (US); Boris Volosskiy, San Jose, CA (US); Sivananda Krishnan Kanakasabapathy, Pleasanton, CA (US); Richard Wise, Los Altos, CA (US); Yang Pan, Los Altos, CA (US); Hui-Jung Wu, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/260,764

(22) Filed: Jan. 29, 2019

(65) Prior Publication Data

US 2019/0237341 A1 Aug. 1, 2019

Related U.S. Application Data

(60) Provisional application No. 62/655,678, filed on Apr. 10, 2018, provisional application No. 62/624,066, filed on Jan. 30, 2018.

(51) Int. Cl.
*H01L 21/3213* (2006.01)
*H01L 21/67* (2006.01)
(Continued)

(52) U.S. Cl.
CPC .... *H01L 21/32136* (2013.01); *C04B 41/5346* (2013.01); *C04B 41/91* (2013.01);
(Continued)

(58) Field of Classification Search
None
See application file for complete search history.

(56) References Cited

U.S. PATENT DOCUMENTS 4,544,444 A * 10/1985 Chang ................... C04B 41/009
204/192.37
4,708,766 A 11/1987 Hynecek
(Continued)

FOREIGN PATENT DOCUMENTS

CN 104752199 A 7/2015
JP S6425420 A 1/1989
(Continued)

OTHER PUBLICATIONS rd301101a, May 1989, RD, Anonymous.*
(Continued)

*Primary Examiner* — Karla A Moore
(74) *Attorney, Agent, or Firm* — Weaver Austin Villeneuve & Sampson LLP

(57) ABSTRACT

Tin oxide films are used as mandrels in semiconductor device manufacturing. In one implementation the process starts by providing a substrate having a plurality of protruding tin oxide features (mandrels) residing on an exposed etch stop layer. Next, a conformal layer of spacer material is formed both on the horizontal surfaces and on the sidewalls of the mandrels. The spacer material is then removed from the horizontal surfaces exposing the tin oxide material of the mandrels, without fully removing the spacer material residing at the sidewalls of the mandrel (e.g., leaving at least 50%, such as at least 90% of initial height at the sidewall). Next, mandrels are selectively removed (e.g., using hydrogen-based etch chemistry), while leaving the spacer material
(Continued)

that resided at the sidewalls of the mandrels. The resulting spacers can be used for patterning the etch stop layer and underlying layers.

15 Claims, 16 Drawing Sheets

(51) Int. Cl.
| | |
|---|---|
| *C04B 41/91* | (2006.01) |
| *C04B 41/53* | (2006.01) |
| *C23C 16/455* | (2006.01) |
| *C23C 16/34* | (2006.01) |
| *C23C 16/40* | (2006.01) |
| *C23C 16/02* | (2006.01) |
| *H01L 21/311* | (2006.01) |
| *H01L 21/465* | (2006.01) |
| *H01L 21/467* | (2006.01) |
| *H01L 21/033* | (2006.01) |

(52) U.S. Cl.
CPC .......... *C23C 16/0227* (2013.01); *C23C 16/34* (2013.01); *C23C 16/401* (2013.01); *C23C 16/45538* (2013.01); *H01L 21/0337* (2013.01); *H01L 21/31116* (2013.01); *H01L 21/31122* (2013.01); *H01L 21/31138* (2013.01); *H01L 21/32139* (2013.01); *H01L 21/465* (2013.01); *H01L 21/467* (2013.01); *H01L 21/67167* (2013.01); *H01L 21/67259* (2013.01)

(56) References Cited

U.S. PATENT DOCUMENTS

| | | | |
|---|---|---|---|
| 4,778,562 A * | 10/1988 | Chang .................. | C04B 41/009 204/192.35 |
| 4,878,993 A | 11/1989 | Rossi et al. | |
| 5,032,221 A | 7/1991 | Roselle et al. | |
| 5,171,401 A | 12/1992 | Roselle | |
| 5,286,337 A | 2/1994 | Tsou | |
| 5,318,664 A | 6/1994 | Saia et al. | |
| 5,607,602 A | 3/1997 | Su et al. | |
| 5,667,631 A | 9/1997 | Holland et al. | |
| 5,723,366 A | 3/1998 | Suzuki et al. | |
| 6,036,876 A * | 3/2000 | Chen .................. | H01L 21/32136 216/67 |
| 6,180,438 B1 | 1/2001 | Deane et al. | |
| 6,368,978 B1 | 4/2002 | Kumar et al. | |
| 6,416,822 B1 | 7/2002 | Chiang et al. | |
| 6,428,859 B1 | 8/2002 | Chiang et al. | |
| 7,459,732 B2 | 12/2008 | Fleischer et al. | |
| 8,163,094 B1 | 4/2012 | Greer et al. | |
| 8,435,608 B1 | 5/2013 | Subramonium et al. | |
| 8,747,964 B2 | 6/2014 | Park et al. | |
| 8,969,110 B2 | 3/2015 | Choi | |
| 9,269,590 B2 | 2/2016 | Luere et al. | |
| 9,287,113 B2 | 3/2016 | Kang et al. | |
| 9,437,443 B2 | 9/2016 | Brink et al. | |
| 9,515,156 B2 | 12/2016 | Besser et al. | |
| 9,523,148 B1 * | 12/2016 | Pore .................. | C23C 16/45536 |
| 9,824,893 B1 * | 11/2017 | Smith .............. | H01L 21/02175 |
| 9,892,917 B2 | 2/2018 | Swaminathan et al. | |
| 10,546,748 B2 | 1/2020 | Yu et al. | |
| 10,665,501 B2 | 5/2020 | Rainville et al. | |
| 11,031,245 B2 | 6/2021 | Smith et al. | |
| 11,088,019 B2 | 8/2021 | Van Cleemput et al. | |
| 11,183,383 B2 | 11/2021 | Smith et al. | |
| 2001/0008227 A1 | 7/2001 | Sadamoto et al. | |
| 2001/0018252 A1 | 8/2001 | Park et al. | |
| 2001/0030860 A1 | 10/2001 | Kimura et al. | |
| 2002/0044230 A1 | 4/2002 | Yamazaki et al. | |
| 2002/0113271 A1 | 8/2002 | Noguchi et al. | |
| 2002/0134425 A1 | 9/2002 | Yamamoto et al. | |
| 2002/0185466 A1 | 12/2002 | Furuta et al. | |
| 2006/0072084 A1 | 4/2006 | Van Herpen et al. | |
| 2006/0073706 A1 | 4/2006 | Li et al. | |
| 2006/0148118 A1 | 7/2006 | Hsiung et al. | |
| 2006/0175558 A1 | 8/2006 | Bakker et al. | |
| 2006/0270209 A1 | 11/2006 | Mitsui et al. | |
| 2007/0040999 A1 | 2/2007 | Wilhelmus Van Herpen et al. | |
| 2007/0069160 A1 | 3/2007 | Banine et al. | |
| 2008/0061030 A1 | 3/2008 | Liu et al. | |
| 2009/0011589 A1 | 1/2009 | Jeon et al. | |
| 2009/0017616 A1 | 1/2009 | Grunow et al. | |
| 2009/0145879 A1 | 6/2009 | Fairbairn et al. | |
| 2009/0233425 A1 | 9/2009 | Furuno et al. | |
| 2010/0099046 A1 | 4/2010 | Kim et al. | |
| 2010/0120247 A1 | 5/2010 | Park | |
| 2010/0159639 A1 | 6/2010 | Sakata | |
| 2010/0195033 A1 | 8/2010 | Takayama et al. | |
| 2011/0121378 A1 | 5/2011 | Ahn et al. | |
| 2011/0198627 A1 | 8/2011 | Maindron et al. | |
| 2011/0306214 A1 | 12/2011 | Zin | |
| 2012/0193632 A1 | 8/2012 | Toriumi | |
| 2013/0161625 A1 | 6/2013 | Ku et al. | |
| 2013/0309871 A1 | 11/2013 | DeVilliers | |
| 2014/0167040 A1 | 6/2014 | Lee et al. | |
| 2014/0308812 A1 | 10/2014 | Arghavani et al. | |
| 2014/0367833 A1 * | 12/2014 | Brink .................. | H01L 21/0338 257/618 |
| 2015/0000737 A1 | 1/2015 | Miyake et al. | |
| 2015/0126042 A1 | 5/2015 | Pasquale et al. | |
| 2015/0140726 A1 | 5/2015 | Honda et al. | |
| 2015/0179414 A1 | 6/2015 | Xiao et al. | |
| 2015/0221541 A1 | 8/2015 | Neman et al. | |
| 2015/0243661 A1 | 8/2015 | Matsumoto | |
| 2015/0247238 A1 | 9/2015 | Pasquale et al. | |
| 2015/0287612 A1 | 10/2015 | Lucre et al. | |
| 2015/0318181 A1 | 11/2015 | Cantone et al. | |
| 2016/0111374 A1 | 4/2016 | Brink et al. | |
| 2016/0111515 A1 | 4/2016 | Besser et al. | |
| 2016/0195812 A1 | 7/2016 | Huang et al. | |
| 2016/0203982 A1 | 7/2016 | Lin et al. | |
| 2016/0293405 A1 | 10/2016 | Matsumoto et al. | |
| 2016/0293438 A1 * | 10/2016 | Zhou .................. | H01L 21/30655 |
| 2016/0314985 A1 | 10/2016 | Yang et al. | |
| 2016/0329207 A1 | 11/2016 | Mohanty et al. | |
| 2016/0336178 A1 | 11/2016 | Swaminathan et al. | |
| 2017/0301552 A1 * | 10/2017 | deVilliers ........... | H01L 21/0337 |
| 2018/0012759 A1 | 1/2018 | Smith et al. | |
| 2018/0233398 A1 | 8/2018 | van Cleemput et al. | |
| 2018/0240667 A1 * | 8/2018 | Yu ..................... | H01L 21/02175 |
| 2018/0277661 A1 | 9/2018 | Nagayama et al. | |
| 2019/0157084 A1 * | 5/2019 | Huang ............... | C23C 16/4583 |
| 2019/0312147 A1 | 10/2019 | Lee et al. | |
| 2019/0390341 A1 * | 12/2019 | Singhal ............. | C23C 16/45565 |
| 2020/0006082 A1 * | 1/2020 | Su ..................... | H01L 21/02183 |
| 2020/0051807 A1 | 2/2020 | Singhal et al. | |
| 2020/0083044 A1 * | 3/2020 | Yu ..................... | H01L 21/02565 |
| 2020/0219725 A1 | 7/2020 | Smith et al. | |
| 2020/0219758 A1 | 7/2020 | van Cleemput et al. | |
| 2021/0017643 A1 | 1/2021 | Kanakasabapathy et al. | |
| 2021/0242019 A1 | 8/2021 | Smith et al. | |
| 2021/0265163 A1 * | 8/2021 | Yu ..................... | H01L 21/02175 |
| 2021/0265173 A1 * | 8/2021 | Yu ..................... | H01L 21/32139 |

FOREIGN PATENT DOCUMENTS

| | | |
|---|---|---|
| JP | H01259184 A | 10/1989 |
| JP | H05267701 A | 10/1993 |
| JP | H09120967 A | 5/1997 |
| JP | 2644758 B2 | 8/1997 |
| JP | 62-179774 A | 8/2007 |
| JP | 2007-208076 A | 8/2007 |
| JP | 2015111668 A | 6/2015 |
| JP | 2015122497 A | 7/2015 |
| KR | 950012151 A | 5/1995 |
| KR | 20040016779 A | 2/2004 |
| KR | 20150053253 A | 5/2015 |
| KR | 10-2017-0141673 A | 12/2017 |
| TW | 134077 | 5/1990 |
| TW | 538137 B | 6/2003 |
| TW | 200531080 A | 9/2005 |

(56) References Cited

FOREIGN PATENT DOCUMENTS

| TW | 200938660 A | 9/2009 |
|---|---|---|
| TW | 201027593 A | 7/2010 |
| TW | 201427084 A | 7/2014 |
| TW | 201546314 A | 12/2015 |

OTHER PUBLICATIONS

U.S. Office Action, dated Apr. 11, 2019, issued in U.S. Appl. No. 15/894,635.
International Search Report and Written Opinion dated May 17, 2019 issued in Application No. PCT/US2019/015559.
U.S. Office Action, dated Feb. 9, 2017, issued in U.S. Appl. No. 15/195,348.
U.S. Notice of Allowance, dated Jun. 26, 2017, issued in U.S. Appl. No. 15/195,348.
International Search Report and Written Opinion dated Jun. 27, 2018 issued in Application No. PCT/US18/18019.
Choi, W.-S., (Dec. 25, 2009) "The Fabrication of Tin Oxide Films by Atomic Layer Deposition using Tetrakis(Ethylmethylamino) Tin Precursor," *Transactions on Electrical and Electronic Materials*, 10(6):200-202.
Du, X. et al., (Jul./Aug. 2005) "In situ examination oftin oxide atomic layer deposition using quartz crystal microbalance and Fourier transform infrared techniques," *J. Vac. Sci. Technol. A*, 23(4):581-588.
Elam, J.W., et al., (2008) "Atomic Layer Deposition of Indium Tin Oxide Thin Films Using Nonhalogenated Precursors," *J. Phys. Chem. C*, 112(6):1938-1945.
Elam, J.W., et al., (Mar./Apr. 2008) "Atomic layer deposition of tin oxide films using tetrakis(dimethylamino) tin," *J. Vac. Sci. Technol. A*, 26(2):244-252.
Heo, J., et al., (2010) "Low Temperature Atomic Layer Deposition of Tin Oxide," *Chemistry of Materials*, 22(17):4964-4973.
Heo, J., et al., (2012) "Atomic layer deposition oftin oxide with nitric oxide as an oxidant gas," *J. Mater. Chem.*, 22:4599-4602.
Kwon, K.H., et al., (Mar./Apr. 2010) "Etch mechanism of $In_2O_3$ and $SnO_2$ thin films in HBr-based inductively coupled plasmas," *J. Vac. Sci. Technol. A* 28(2):226-231.
Li, X., et al., (2012) "Tin Oxide with Controlled Morphology and Crystallinity by Atomic Layer Deposition onto Graphene Nanosheets for Enhanced Lithium Storage," *Advanced Function Materials*, 22:1647-1654.
Mohri et al., (Oct. 1990) "Plasma Etching of ITO Thin Films Using a $CH_4/H_2$ Gas Mixture," *Japanese Journal of Applied Physics*, 29(10):L1932-L1935.
Mullings, M.N., et al., (Nov./Dec. 2013) "Tin oxide atomic layer deposition from tetrakis(dimethylamino)tin and water," *J. Vac. Sci. Technol. A*, 31(6):061503-1-061503-8.
Wolf, S. and Tauber, R.N. (1986) "Silicon Processing for the VLSI Era," *Process Technology*,vol. 1, Lattice Press, pp. 545-547.
Wu, B.-R., et al., (2014) "Texture-Etched $SnO_2$ Glasses Applied to Silicon Thin-Film Solar Cells," *Journal of Nanomaterials*, vol. 2014, Article ID 907610, 9 pages.
U.S. Office Action, dated Dec. 26, 2019, issued in U.S. Appl. No. 15/713,377.
U.S. Office Action, dated Sep. 13, 2019, issued in U.S. Appl. No. 15/893,458.
U.S. Final Office Action, dated Mar. 19, 2020, issued in U.S. Appl. No. 15/893,458.
U.S. Notice of Allowance, dated Aug. 21, 2019, issued in U.S. Appl. No. 15/894,635.
Chinese First Office Action dated Jan. 6, 2020 issued in Application No. CN 201710498301.5.
International Preliminary Report on Patentability dated Aug. 29, 2019 issued in Application No. PCT/US2018/018019.
U.S. Appl. No. 16/825,473, filed Mar. 20, 2020, van Cleemput et al.
U.S. Appl. No. 16/825,514, filed Mar. 20, 2020, Smith et al.
U.S. Final Office Action, dated Apr. 16, 2020, issued in U.S. Appl. No. 15/713,377.
U.S. Office Action, dated Sep. 14, 2020, issued in U.S. Appl. No. 15/713,377.
U.S. Office Action, dated Aug. 3, 2020, issued in U.S. Appl. No. 15/893,458.
Chinese Second Office Action dated Jun. 15, 2020 issued in Application No. CN 201710498301.5.
International Search Report and Written Opinion (ISA/KR) dated Jul. 3, 2019 issued in Application No. PCT/US2019/022319.
International Preliminary Report on Patentability dated Aug. 13, 2020 issued in Application No. PCT/US2019/015559.
Gordon, et al., (1992) "Low-Temperature Atmospheric Pressure Chemical Vapor Deposition of Polycrystalline Tin Nitride Thin Films" *Chem. Mater.* 1992, 4, pp. 68-71.
International Preliminary Report and Patentability (ISA/KR) dated Oct. 1, 2020 issued in Application No. PCT/US2019/022319.
U.S. Appl. No. 16/982,489, filed Sep. 18, 2020, Kanakasabapathy et al.
U.S. Notice of Allowance dated Jan. 26, 2021 issued in U.S. Appl. No. 15/713,377.
U.S. Final Office Action, dated Dec. 15, 2020, issued in U.S. Appl. No. 15/893,458.
Taiwanese First Office Action dated Dec. 2, 2020 issued in Application No. TW 106121182.
U.S. Office Action, dated Mar. 30, 2021, issued in U.S. Appl. No. 16/687,142.
International Search Report and Written Opinion dated Oct. 5, 2020, in application No. PCT/US2020/038996.
Japanese First Office Action dated Aug. 3, 2021 issued in Application No. JP 2017-120945.
Japanese Journal of Applied Physics, vol. 27, No. 9, Sep. 1988, T. Minami et al.: "Reactive ion etching of transparent conducting tin oxide films using electron cyclotron resonance hydrogen plasma", pp. L 1753-L 1756 (Year: 1988).
Korean First Office Action dated Aug. 18, 2021 issued in Application No. KR 10-2017-0077686.
Korean First Office Action dated Jul. 30, 2021 issued in Application No. KR 10-2021-7017077.
KR Office Action dated Aug. 18, 2021, in application No. KR1020200034960.
Notice of Allowance dated Nov. 16, 2021, in U.S. Appl. No. 16/687,142.
Notice of Allowance dated Oct. 27, 2021, in U.S. Appl. No. 16/825,514.
Taiwanese First Office Action dated Jun. 17, 2021 issued in Application No. TW 107104861.
Taiwanese Second Office Action dated Jul. 20, 2021 issued in Application No. TW 106121182.
TW Office Action dated Aug. 27, 2021, in Application No. TW110121421 with English translation.
TW Office Action dated Sep. 7, 2021, in TW Application No. TW107105182 with English translation.
TW Rejection Decision dated Oct. 21, 2021, in application No. TW107104861 with English translation.
U.S. Appl. No. 17/448,284, filed Sep. 21, 2021.
U.S. Corrected Notice of Allowability dated Dec. 1, 2021, in U.S. Appl. No. 16/687,142.
U.S. Notice of Allowance dated Apr. 2, 2021 issued in U.S. Appl. No. 15/893,458.
U.S. Notice of Allowance dated Jun. 23, 2021 issued in U.S. Appl. No. 16/825,514.
U.S. Office Action dated Jun. 24, 2021 issued in U.S. Appl. No. 16/825,473.
U.S. Office Action dated Oct. 22, 2021 issued in U.S. Appl. No. 16/825,473.
U.S. Office Action Interview Summary, dated Mar. 11, 2021, issued in U.S. Appl. No. 15/893,458.
Co-pending U.S. Appl. No. 17/448,284, filed Sep. 21, 2021.
International Preliminary Report on Patentability dated Jan. 6, 2022 in PCT Application No. PCT/US2020/038996.
TW Office Action dated Dec. 30, 2021, in application No. 110121421 with English translation.

(56) References Cited

OTHER PUBLICATIONS

JP Office Action dated Feb. 1, 2022, in Application No. JP2018-021500 with English translation.
JP Office Action dated Mar. 29, 2022, in Application No. JP2019-543306 with English translation.
KR Office Action dated Feb. 17, 2022, in Application No. KR10-2021-7017077 with English translation.
KR Office Action dated Mar. 29, 2022, in Application No. KR1020170077686 with English translation.
KR Office Action dated Mar. 29, 2022, in Application No. KR1020200034960 with English translation.
U.S. Appl. No. 17/650,550, filed Feb. 10, 2022.
U.S. Appl. No. 17/650,551, filed Feb. 10, 2022.
U.S. Corrected Notice of Allowance dated Feb. 22, 2022 in U.S. Appl. No. 16/687,142.
U.S. Corrected Notice of Allowance dated Mar. 17, 2022 in U.S. Appl. No. 16/687,142.
U.S. Final Office Action dated Feb. 17, 2022 in U.S. Appl. No. 16/825,473.
U.S. Notice of Allowance dated Apr. 4, 2022, in U.S. Appl. No. 16/687,142.
U.S. Restriction Requirement dated Mar. 17, 2022, in U.S. Appl. No. 17/302,044.

\* cited by examiner

TIN OXIDE MANDRELS IN PATTERNING

CROSS-REFERENCE TO RELATED APPLICATIONS

This application claims the benefit of U.S. Provisional Patent Application No. 62/655,678, filed on Apr. 10, 2018, titled "Tin Oxide Mandrels in Patterning" naming Yu et al. as inventors, and of U.S. Provisional Patent Application No. 62/624,066, filed on Jan. 30, 2018, titled "Spacer formation Using Tin Oxide Mandrels" naming Tan et al. as inventors which are herein incorporated by reference in their entirety.

FIELD OF THE INVENTION

This invention pertains to methods of semiconductor device manufacturing. Specifically, embodiments of this invention pertain to methods of using tin oxide films in semiconductor processing.

BACKGROUND

In integrated circuit (IC) fabrication, deposition and etching techniques are used for forming patterns of materials, such as for forming metal lines embedded in dielectric layers. Some patterning schemes involve the use of spacers that enable precise patterning and formation of small-scale features. Spacers are formed on a substrate, such that they are separated by defined distances (typically determined by previous patterning), and are used as masks for patterning of underlying layers. The materials of spacers and of surrounding layers are selected to have appropriate etch selectivity that would enable both formation of spacers, and patterning of underlying layers. After the patterning is completed, the spacers are removed by etching, and are not part of the final fabricated semiconductor device.

Spacers are used for patterning in a variety of applications, including formation of dynamic random-access memory (DRAM), patterning fins in fin field effect transistors (finFETs), and in back end of line (BEOL) processing.

Spacers can be formed on semiconductor substrates using patterning processes that involve mandrels—larger protruding features that serve as a scaffold for the spacers and that are subsequently selectively removed by etching methods that leave the spacers on the substrate.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Tin oxide is used as a mandrel material in the patterning of semiconductor substrates. Patterning methods provided herein can achieve high level of control over spacer and mandrel geometry, as well as high efficiency.

In one aspect, a method of processing a semiconductor substrate using tin oxide mandrels is provided. In some implementations the method includes: (a) providing a semiconductor substrate having a plurality of tin oxide protruding features (mandrels) residing on an etch stop layer (ESL); (b) forming a layer of a spacer material on both the horizontal surfaces and the sidewalls of the tin oxide protruding features; and (c) removing the spacer material from the horizontal surfaces of the tin oxide protruding features to expose an underlying tin oxide, without completely removing the spacer material at the sidewalls of the tin oxide protruding features. In some embodiments the process further includes an operation of removing the tin oxide protruding features without completely removing the spacer material that has previously resided at the sidewalls of the tin oxide protruding features, thereby forming a plurality of spacers residing over the etch stop layer. In some embodiments, after the tin oxide protruding features have been removed, the method follows by etching the etch stop layer in a presence of the plurality of spacers.

In some embodiments the spacer material is a silicon-containing material (e.g., silicon oxide, silicon nitride, silicon carbide, SiOC, SiNO, SiCNO, or SiCN) or titanium dioxide. In one implementation the spacer material is titanium dioxide and the etch stop layer includes a silicon-containing material. In other embodiments the spacer material is silicon oxide, and the etch stop layer comprises tungsten.

The spacer etch chemistry used in operation (c) can vary depending on the chemistry of the spacer material. In some embodiments the spacer material is a silicon-containing material, and removing the spacer material from horizontal surfaces in (c) comprises etching the spacer material using fluorine-based etch chemistry. In other embodiments the spacer material is titanium dioxide, and removing the spacer material from horizontal surfaces in (c) comprises etching the spacer material using chlorine-based etch chemistry.

In some embodiments, after the spacer material has been removed from the horizontal surfaces and after the tin oxide has been exposed, the process follows by (d) removing the tin oxide protruding features (mandrels) without completely removing the spacer material that has previously resided at the sidewalls of the tin oxide protruding features, thereby forming a plurality of spacers residing over the etch stop layer, where the tin oxide protruding features are removed using a hydrogen-based etch chemistry that results in a formation of a tin hydride. In some implementations removing the tin oxide protruding features comprises contacting the semiconductor substrate with a plasma-activated hydrogen-containing reactant selected from the group consisting of $H_2$, HBr, $NH_3$, $H_2O$, a hydrocarbon, and combinations thereof.

The semiconductor substrate having a plurality of tin oxide protruding features provided in operation (a) can be formed using several distinct process flows. In one implementation, forming the plurality of the tin oxide protruding features on the semiconductor substrate is accomplished by patterning a planar (blanket) tin oxide layer. In another implementation, forming the plurality of the tin oxide protruding features includes: (i) forming a plurality of first mandrels (e.g., photoresist or other carbon-containing mandrels) on the semiconductor substrate; (ii) conformally depositing a layer of tin oxide over the plurality of first mandrels; and (iii) etching the deposited layer of tin oxide from horizontal surfaces and removing the plurality of first mandrels to form the plurality of the tin oxide protruding features on the semiconductor substrate provided in (a), wherein the formed plurality of the tin oxide protruding features serve as second mandrels in subsequent operations (b)-(c). In some implementations, the first mandrels comprise a carbon-containing material, such as photoresist, diamond-like carbon, or amorphous carbon, and operation (iii) includes etching the deposited layer of tin oxide from horizontal surfaces using a hydrogen-based etch chemistry (e.g., using $H_2$ or a hydrocarbon, such as $CH_4$ or $C_2H_2$ as a hydrogen-containing gas) or chlorine-based etch chemistry (e.g., using Cl$_2$ and/or BCl$_3$), and then removing the plurality of first mandrels using an oxygen-based etch chemistry.

In some embodiments provided methods are used in conjunction with photolithographic processes. For example, in some implementations the processes include applying photoresist to the semiconductor substrate, exposing the photoresist to light, patterning the photoresist and transferring the pattern to the substrate, and selectively removing the photoresist from the substrate. In another aspect a system for processing a semiconductor substrate is provided. In some embodiments the system includes: one or more deposition chambers; one or more etch chambers; and a system controller comprising program instructions for causing a series of operations. In some embodiments, the program instructions are for: on the semiconductor substrate comprising a plurality of tin oxide protruding features, causing a deposition of a spacer material on both the horizontal surfaces and the sidewalls of the tin oxide protruding features; and causing a removal of the spacer material from the horizontal surfaces of the tin oxide protruding features to expose an underlying tin oxide, without causing a complete removal of the spacer material at the sidewalls of the tin oxide protruding features. The system controller may further include program instructions for causing a removal of the tin oxide protruding features without causing a complete removal of the spacer material that has previously resided at the sidewalls of the tin oxide protruding features, to thereby form a plurality of spacers on the semiconductor substrate. The system controller may further include program instructions for causing the formation of the semiconductor substrate comprising the plurality of tin oxide protruding features by causing a deposition of a conformal tin oxide layer over a semiconductor substrate having a plurality of first mandrels, followed by removal of the tin oxide material from horizontal surfaces and by removal of the first mandrels.

In another aspect, an etching apparatus is provided. In some embodiments the etching apparatus includes: an etching process chamber having an inlet for a process gas; a substrate holder configured for holding a semiconductor substrate in the etching process chamber; and a process controller comprising program instructions for causing one or more operations. In some embodiments the process controller includes program instructions for causing an etching of a layer of a spacer material coating a plurality of tin oxide protruding features on the semiconductor substrate such that the spacer material is completely removed from the horizontal surfaces of the semiconductor substrate without being completely removed at the sidewalls of the plurality of tin oxide protruding features. In some embodiments, the program instructions for causing etching of the spacer material include program instructions for causing the etching of the layer of the spacer material using a fluorine-based etch chemistry, wherein the spacer material is a silicon-containing material.

In another aspect an apparatus is provided, where the apparatus includes a process chamber and a controller having program instructions for causing any of the methods provided herein.

In another aspect, a partially fabricated semiconductor device is provided, wherein the partially fabricated semiconductor device includes a plurality of tin oxide protruding features coated with a conformal layer of a spacer material.

These and other aspects of implementations of the subject matter described in this specification are set forth in the accompanying drawings and the description below.

DETAILED DESCRIPTION OF THE PREFERRED EMBODIMENTS

Figure 1A:
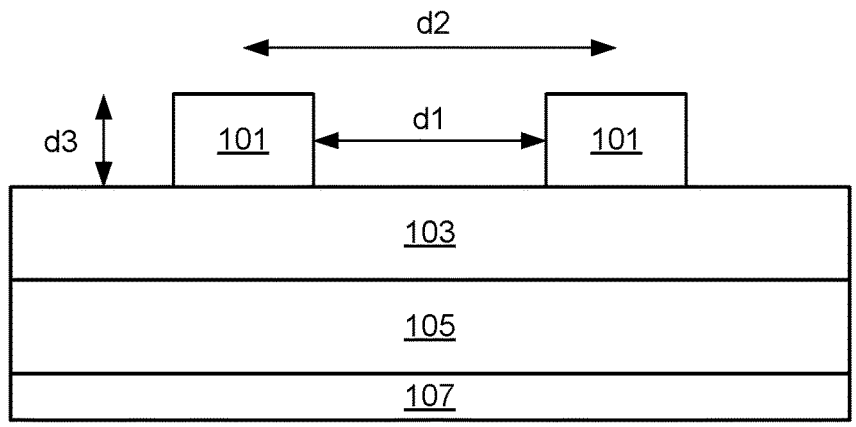
FIGS. 1A-1F show schematic cross-sectional views of a semiconductor substrate undergoing processing that involves spacer formation, according to embodiments provided herein.

Methods that employ tin oxide films in semiconductor device manufacturing are provided. The methods utilize a number of etching processes with tunable etch rates and selectivities that allow integration of tin oxide films into process schemes that employ a wide variety of materials, such as silicon-containing compounds (e.g., silicon oxide (SiO$_2$), silicon carbide (SiC), silicon nitride (SiN), silicon oxycarbide (SiOC), silicon oxynitride (SiNO), silicon oxycarbonitride (SiCNO), and silicon carbonitride (SiCN)), elemental silicon (Si), carbon (including amorphous carbon and diamond-like carbon), photoresist, carbon-containing compounds (e.g., organic polymers, metal carbides, tungsten-containing carbon), metals (e.g., tungsten), metal oxides (e.g., titanium oxide, hafnium oxide, zirconium oxide, tantalum oxide), and metal nitrides (e.g., tantalum nitride (TaN) and titanium nitride (TiN)). In some embodiments tin oxide is etched in a presence of any of these materials with an etch selectivity of at least 10:1, such as at least 20:1. In some embodiments, any of these materials is etched in a presence of tin oxide with an etch selectivity of at least 10:1, such as at least 20:1. The selectivities refer to ratios of etch rates of materials. For example, if the ratio of etch rate of silicon oxide to the etch rate of tin oxide is at least 10:1 for a specific etch chemistry, then silicon oxide is etched with at least 10:1 selectivity relative to tin oxide with this etch chemistry.

In the provided embodiments, tin oxide is used in patterning processes, where the tin oxide film is used as a mandrel for spacer formation. For example, tin oxide can be a mandrel in self-aligned double patterning (SADP), or in self-aligned quadruple patterning (SAQP). In conjunction with selective etching processes, tin oxide meets stringent critical dimension (CD)/profile and selectivity requirements that are imposed by these applications. The etching processes can be implemented on a variety of tools that allow plasma etching, such as Kiyo® and Flex™ etch tools provided by Lam Research Corporation.

Tin oxide can be etched selectively to a wide variety of materials using hydrogen-based etches that convert tin oxide to volatile tin hydride products (e.g., tin tetrahydride). The term "tin hydride" as used herein includes a plurality of tin hydrides (compounds with tin-hydrogen bonding) and is not limited only to tin tetrahydride ($SnH_4$)). Terms like "tin chloride" and "silicon fluoride" similarly may include multiple chlorides and fluorides. Tin tetrahydride, unlike hydrides of many other metals, has a low boiling point, and therefore can be easily removed from the process chambers by purging and/or evacuation thereby making hydrogen-based etch a particularly attractive process for selective tin oxide etching.

Tin oxide, as used herein, refers to materials that include tin (Sn) and oxygen (O), and may optionally include hydrogen. Tin oxide, as used herein, may further include small amounts of other elements, such as carbon, and nitrogen (e.g., $SnO_xN_y$), where the total amount of other elements is 10 atomic % or less (where hydrogen is not included in the calculation of the content). For example ALD-deposited tin oxide can contain about 0.5-5 atomic % carbon. Tin oxide can be deposited, for example, by ALD, PECVD, or PVD. The stoichiometry of tin oxide generally can vary. In some embodiments the atomic ratio of tin to oxygen is about 1:2 ($SnO_2$). It is understood that small deviations from 1:2 tin to oxygen stoichiometry are possible in $SnO_2$ and are within the scope of $SnO_2$ structure. For example, O to Sn atomic ratio is between about 2.0-2.3 in some examples of $SnO_2$. Tin oxides with O to Sn ratio of between about 1.5-2.5 are within the scope of $SnO_2$ material, as used herein. Tin oxide materials described herein are distinct from indium tin oxide materials, and other mixed metal oxides.

It is understood that in other chemical compounds as used herein, stoichiometry may vary, unless it is specified. For example, formulas such as SiN and HfO specify the elements that are present but not the stoichiometry. Further, it is understood that materials described herein may include hydrogen (even if not specified in the formula) and small amounts of dopants not explicitly listed in the chemical name (such as less than 10 atomic % of a dopant).

The term "semiconductor substrate" as used herein refers to a substrate at any stage of semiconductor device fabrication containing a semiconductor material anywhere within its structure. It is understood that the semiconductor material in the semiconductor substrate does not need to be exposed. Semiconductor wafers having a plurality of layers of other materials (e.g., dielectrics) covering the semiconductor material, are examples of semiconductor substrates. The following detailed description assumes the disclosed implementations are implemented on a wafer. However, the disclosed implementations are not so limited. The work piece may be of various shapes, sizes, and materials. In addition to semiconductor wafers, other work pieces that may take advantage of the disclosed implementations include various articles such as printed circuit boards and the like.

The term "about" when used in conjunction with numerical values refers to a range that is within 5% of the stated numerical value, unless otherwise stated.

In some embodiments, provided selective etch chemistries are used to remove certain materials or features on a substrate without removing other materials or features. As used herein, the etch chemistry "removes" a material or feature when at least 90% (such as 100%) of the material or feature is removed (referring to thickness in vertical direction). The term "without removing", as used herein means that at least 50% of material or feature (such as at least 80%) remains after the etch, where % refers to thickness in a vertical direction.

In some embodiments provided methods are used to remove materials from horizontal surfaces without removing materials residing at sidewalls of protruding features. It is understood that horizontal surfaces, as used herein, include surfaces with local deviations from horizontal plane, such as convex caps on top of protruding features.

A variety of etch chemistries have been developed for selective etching of tin oxide in a presence of other materials, as well as for selective etching of other materials in a presence of tin oxide. Selective etching of tin oxide in a presence of another material refers to tin oxide etching, wherein the ratio of the etch rate of tin oxide to the etch rate of the other material is greater than one, and wherein the other material is exposed to the same etch chemistry as tin oxide at any time of the etching process. For example, the other material may be exposed when the etching begins, or may become exposed during the course of etching. Etch selectivity for selective etching of tin oxide in a presence of another material refers to a ratio of an etch rate of tin oxide to an etch rate of the other material for a given chemistry. For example, tin oxide can be selectively etched in a presence of a silicon-containing compound using a hydrogen-based etch chemistry with an etch selectivity of greater than 50.

Similarly, selective etching of a material in a presence of tin oxide refers to such etching of that material, where the ratio of an etch rate of that material to the etch rate of tin oxide is greater than one, and wherein tin oxide is exposed to the same etch chemistry as the etched material at any time of the etching process. For example, tin oxide may be exposed when the etching begins, or it may become exposed during the course of etching. Etch selectivity of a selective etch of a material in a presence of tin oxide refers to a ratio of an etch rate of that material to an etch rate of tin oxide for a given chemistry. For example, carbon can be selectively etched in a presence of tin oxide using an oxygen-based etch chemistry with an etch selectivity of greater than 50.

In some embodiments methods for removing tin oxide mandrels are provided. First, a semiconductor substrate is provided, where the semiconductor substrate includes a plurality of tin oxide protruding features (mandrels) and a layer of a spacer material, where the spacer material resides at the sidewalls of the tin oxide protruding features. Next, tin oxide is selectively etched in a presence of the second material using one of the selective tin oxide etch chemistries described herein. The tin oxide protruding features can be removed by these selective etches, without fully removing the spacer material that has previously resided at the sidewalls, thereby forming a plurality of spacers.

In some embodiments methods for removing spacer material from horizontal surfaces on a substrate are provided, wherein the spacer material coats tin oxide mandrels. First, a semiconductor substrate is provided, where the semiconductor substrate includes a plurality of tin oxide protruding features (mandrels) and a conformal layer of a spacer material that resides both on the horizontal surfaces and at the sidewalls of the tin oxide mandrels. Next, spacer material is removed from the horizontal surfaces, without fully removing spacer material at the sidewalls, and tin oxide is exposed. This step can be performed by any of the selective etch chemistries that allow for selective spacer material etching in a presence of tin oxide, described herein.

In some embodiments methods for depositing a conformal layer of spacer material over a plurality of tin oxide mandrels are provided. First, a semiconductor substrate is provided, where the semiconductor substrate includes a plurality of tin oxide mandrels. Next, a spacer material (e.g., a silicon-containing material) is deposited over the substrate such that it coats the mandrels both at the sidewalls and over horizontal surfaces.

Hydrogen-Based Etch.

In some embodiments selective tin oxide etching is performed using a hydrogen-based etch. Hydrogen-based etch involves exposing tin oxide to a hydrogen-containing reactant (typically with plasma activation of the reactant) such that it converts tin oxide to a volatile tin hydride. $SnH_4$ has a boiling temperature of $-52°$ C. and can be easily removed from the process chamber. Examples of hydrogen-containing reactants include $H_2$, HBr, $NH_3$, $H_2O$, and hydrocarbons (such as $CH_4$, $C_2H_2$, etc.). Mixtures of hydrogen-containing reactants can also be used. Hydrogen-based etching involves forming a plasma in a process gas containing a hydrogen-containing reactant, and, optionally, an inert gas, and contacting the substrate with the formed plasma. Examples of inert gases include nitrogen ($N_2$), helium (He), argon (Ar), and neon (Ne), and xenon (Xe). In some embodiments $H_2$ is the preferred hydrogen-containing reactant, and in some embodiments it is preferable to form plasma in a gas that contains at least 50%, such as at least 80% $H_2$ by volume. In other embodiments HBr is used as the hydrogen-containing reactant. For example tin oxide can be selectively etched with a plasma formed in a process gas consisting essentially of HBr and an inert gas, such as in a mixture of HBr, $N_2$ and argon. The hydrogen-based etch is typically conducted with a process gas that does not include oxygen-containing and fluorine-containing species. In some embodiments, the process gas consists essentially of one or more hydrogen-containing reactants and, optionally, an inert gas.

Hydrogen-based etch can selectively remove tin oxide in a presence of the following materials: silicon-containing compounds, such as $SiO_2$, SiN, SiC, SiOC, SiCN, SiON, SiCNO, spin on glass; metal oxides, such as titanium oxide, tungsten oxide, and zirconium oxide; metal nitrides, such as titanium nitride and tantalum nitride; metals, such as tungsten; and carbon-containing organic materials (e.g., photoresist and organic polymers). Further, hydrogen based etch can be used to selectively etch tin oxide in a presence of silicon oxide covered silicon. Silicon oxide often forms on silicon surfaces when silicon is exposed to atmosphere. Hydrogen-based etch can be also used to selectively etch tin oxide in a presence of elemental silicon (e.g., amorphous silicon), and carbon. Further, hydrogen-based etch can be used to selectively etch tin oxide in a presence of metal carbides, and materials that contain metal and carbon. For example, tin oxide can be selectively etched with a hydrogen-based etch in a presence of a tungsten carbon material (also referred to as tungsten-doped carbon). In some embodiments, tungsten carbon material includes between about 20-60 atomic % tungsten.

In some embodiments, methods for removing tin oxide mandrels in a presence of any of these materials, are provided. First, a semiconductor substrate is provided, where the semiconductor substrate includes a plurality of exposed tin oxide mandrels and a layer of any of these materials (e.g., these materials may be spacer materials residing at the sidewalls of tin oxide mandrels, or these materials may be ESL materials). Next, tin oxide is selectively etched in a presence of these materials. For example, tin oxide mandrels can be removed by a hydrogen-based etch without fully removing the spacer material residing at the sidewalls of tin oxide mandrels and without fully removing the ESL material. These materials may be exposed prior to this etch or may become exposed during the course of tin oxide etching.

The etch selectivity of the hydrogen-based etch in some embodiments is greater than 10, such as greater than 30, e.g., greater than 50, or greater than 80. The etch selectivity refers to the ratio of the etch rate of tin oxide to the etch rate of the other material for selected process conditions. In some examples, etch selectivity of 100 was achieved for etching tin oxide relative to $SiO_2$ with the use of $H_2$ plasma.

The tin oxide etching methods that utilize hydrogen plasma (referring to a plasma formed in a hydrogen-containing reactant) can be implemented in a variety of apparatuses under a wide range of process conditions. In one implementation the methods involve, providing a semiconductor substrate having an exposed layer of tin oxide to an etch chamber, and contacting the substrate with a plasma formed in a process gas comprising $H_2$ (or another hydrogen-containing gas), and, optionally a carrier gas, such as helium or another inert gas. The term "etch chamber" or an "etching apparatus" refers to a chamber and an apparatus that are configured for etching. In some embodiments the "etch chamber" or the "etching apparatus" are exclusively configured for etching operations. In other embodiments the "etch chamber" or "etching apparatus" may be configured to perform other operations in addition to etching, such as, for example, deposition. For example, in some embodiments the etch chamber may also be used for ALD deposition.

In some embodiments the plasma used for in the hydrogen plasma etch is generated in the same process chamber that houses the semiconductor substrate. In other embodiments the plasma is generated remotely, and is introduced into the process chamber that houses the substrate through one or more inlets in the process chamber.

The etching is controlled such as to convert tin oxide to a volatile tin hydride. In one embodiment the $H_2$ content in the process gas is at least 50% by volume, such as at least 80% by volume (can be up to and including 100%). In some embodiments, the process gas may further include a hydrocarbon, such as $CH_4$. In some embodiments, the process gas further includes $Cl_2$. For example, the process gas may consist essentially of $H_2$ and an inert gas (e.g., He), or the process gas may consist essentially of $H_2$, inert gas and a hydrocarbon (e.g., $CH_4$). The etch is performed at a temperature of less than about 100° C., measured near the substrate. The etch reaction, advantageously, generates only volatile materials, such as $SnH_4$, which can be easily removed from the etch process chamber by evacuation and/or purging. The etch process temperature is preferably selected to be less than about 100° C., because higher temperatures can lead to decomposition of formed $SnH_4$ and to formation of particles that can contaminate the process chamber and the substrate. The composition of the process gas and process conditions are selected such as to reduce or eliminate formation of particles during the etch. Significantly, the etch reaction does not require any significant sputtering component, and can be performed in an absence of external bias at the substrate, and in an absence of heavy ions (e.g., argon ions). Reducing sputtering component can be beneficial for increasing the etch selectivity relative to the second material on the substrate. Thus, in some embodiments etching is performed without providing an external bias to the substrate and/or involves using helium (a light gas) as the carrier gas, in order to reduce sputtering.

Plasma for the hydrogen plasma etch can be generated using a variety of frequencies (low and high). Examples of suitable frequencies include 400 KHz, 2 MHz, 13.56 MHz, 27 MHz or 2.45 GHz. Power used for plasma generation can range in some embodiments, from between about 50 W to 1,000 W corresponding to power density of between about 0.0018 and 0.36 W/cm$^2$. The bias at the substrate is optional, and bias power can range from about 0 to 500 W. Suitable gas flow rates per showerhead (for processing one 300 mm wafer) are:
i. $H_2$: 25 to 750 sccm;
ii. $Cl_2$: 0 to 500 sccm (e.g., 5-200 sccm);
iii. He: 0 to 500 sccm (e.g., 5-100 sccm); and
iv. $CH_4$: 0 to 500 sccm (e.g., 5-100 sccm).

The etch process can be performed, in some embodiments, at a pressure of between about 1 to 175 mTorr.

In some specific embodiments the plasma is generated using high frequency generation (e.g., 13.56 MHz or 27 MHz), and it is provided using plasma power of between about 200 to 500 W corresponding to power density of 0.07 and 0.18 W/cm$^2$. The power for the bias at the substrate is between about 0 and 200 W. Suitable gas flow rates per showerhead (for processing one 300 mm wafer) are:
i. $H_2$: 100 to 300 sccm;
ii. $Cl_2$: 0 to 200 sccm (e.g., 5-100 sccm);
iii. He: 0 to 100 sccm (e.g., 5-50 sccm);
iv. $CH_4$: 0 to 100 sccm (e.g., 5-50 sccm).

The etch process is performed in these embodiments at a pressure of between about 1 to 30 mTorr.

The selectivity of the hydrogen-based etch can be significantly increased by using carbon-containing reactants in the process gas that form a carbon-containing polymer (e.g. $CH_x$ polymer) on the surface of the substrate during the etch. In some embodiments, the process gas used in this embodiment includes $H_2$ and a hydrocarbon (e.g., methane ($CH_4$)). The process gas typically also includes an inert gas. The ratio of $H_2$ to hydrocarbon, in some embodiments is preferably at least 5, such as at least 10. In some embodiments the volume ratio of $H_2$ to hydrocarbon is between about 5-500, such as about 10-300. In some embodiments selective etching of tin oxide in a presence of another material (or materials) includes exposing the substrate to a plasma formed in a process gas comprising $H_2$ and a hydrocarbon (e.g., $CH_4$). In one implementation $H_2$ is provided at a flow rate of between about 100-500 sccm, and hydrocarbon is provided at a flow rate of between about 1-20 sccm (such as between about 5-10 sccm). The process can be conducted using plasma power of between about 100-1,000 W, such as between about 200-500 W (for a single 300 mm wafer), corresponding to power densities of between about 0.14-1.3 W/cm$^2$, such as 0.28-0.71 W/cm$^2$. In some implementations, the etch is conducted using a substrate bias of between about 50-500 Vb, such as between about 100-200 Vb. The process is preferably performed at a temperature of less than about 100° C. In one specific example the following gases are provided: $H_2$ at 100 sccm; $CH_4$ at 5 sccm, and helium at 100 sccm. The plasma is formed in the process gas using a power of 300 W, and the substrate bias of 100 Vb at 25% duty cycle is used. The process is performed at 30° C. and at a pressure of 5 mTorr. The formation of carbon-containing polymer on a substrate as described herein can increase the etch selectivity of tin oxide relative to any of the materials listed herein. This effect is particularly useful when tin oxide is etched in a presence of photoresist, carbon, carbon-containing materials, and silicon (Si). For example when the etching is conducted in a presence of photoresist, the etch selectivity can be greater than 100, and in some cases is nearly infinite. The use of this highly selective etch allows the use of photoresist of smaller thickness to lower photolithographic exposure dose and/or to prevent photoresist line collapse due to high aspect ratio at small fine pitch. In the described method the $CH_x$ polymer protects the photoresist from being etched. Further this etch can be used to improve the geometry of the photoresist layer. In some embodiments, the tin oxide on a semiconductor substrate is selectively etched using this etch in a presence of a photoresist disposed above the tin oxide layer, and in a presence of a material that underlies tin oxide, with an etch selectivity of at least 10 relative to both photoresist and the material that underlies tin oxide. In some embodiments the material that underlies tin oxide includes one or more of silicon (e.g., amorphous silicon), silicon-containing compound (e.g., $SiO_2$, SiN, SiC, SiON, SiOC), carbon (e.g., amorphous carbon), and a carbon-containing compound (e.g., carbon tungsten).

In some embodiments, HBr is used as a hydrogen-containing reactant in the hydrogen-based etch. In one implementation, the etching method involves flowing HBr at a flow rate of 50-100 sccm, and an inert gas (e.g., helium) at a flow rate of 100-500 sccm and forming a plasma in this process gas using RF power of 100-1,000 W (per one 300 mm wafer) corresponding to power densities of 0.14-1.42 W/cm$^2$. This etch can be conducted with or without a substrate bias. For example, substrate bias may be between 0-200 Vb, such as 50-200 Vb. The process can be performed at a temperature of less than 100° C. and a pressure of 5-50 mTorr.

Chlorine-Based Etch.

In some embodiments selective tin oxide etching is performed using a chlorine-based etch. Chlorine-based etch involves exposing tin oxide to a chlorine-containing reactant (typically with plasma activation of the reactant) such that it converts tin oxide to a tin chloride. $SnCl_4$ has a boiling point of 114° C. and can be removed from the process chambers. Examples of suitable chlorine-containing reactants include $Cl_2$, and $BCl_3$. Mixture of $Cl_2$ and $BCl_3$ is used in one embodiment. Chlorine-based etching involves, in one implementation, forming a plasma in a process gas containing a chlorine-containing reactant, and, optionally, an inert gas, and contacting the substrate with the formed plasma. Chlorine-based etch can selectively remove tin oxide in a presence of the following materials: silicon-containing compounds, such as $SiO_2$, SiN, SiC, SiOC, SiCN, SiON, SiCNO, spin on glass, carbon, and photoresist, although the selectivity for silicon-containing material is typically lower than with a hydrogen-based etch. In some embodiments a semiconductor substrate is provided, where the semiconductor substrate includes an exposed tin oxide layer (e.g., a tin oxide mandrel) and a layer of any of these materials (e.g., as a spacer material at the mandrel sidewalls or as an ESL material). Next, tin oxide is selectively etched in a presence of these materials using the chlorine-based etch. These materials may be exposed prior to this etch or may become exposed during the course of tin oxide etching. In one implementation tin oxide is selectively etched in a presence of any of these materials using a $BCl_3/Cl_2$ etch. In one implementation, the etching method involves flowing $BCl_3$ at a flow rate of 5-100 sccm, $Cl_2$ at a flow rate of 50-500 sccm and an inert gas (e.g., helium) at a flow rate of 100-500 sccm and forming a plasma in this process gas using RF power of 100-1,000 W (per one 300 mm wafer) corresponding to power densities of 0.14-1.42 W/cm$^2$. This etch can be conducted with or without a substrate bias. For example, substrate bias may be between 0-100 Vb, such as 10-100 Vb. The process can be performed at a temperature of less than 100° C. and a pressure of 5-50 mTorr.

In some embodiments chlorine-based etch is used to selectively etch certain metal oxides in a presence of tin oxide. For example titanium oxide can be selectively etched in a presence of tin oxide using chlorine-based etch. In some embodiments a semiconductor substrate is provided, where the semiconductor substrate includes an exposed titanium oxide layer and a layer of tin oxide. Next, titanium oxide is selectively etched in a presence of tin oxide using the chlorine-based etch chemistry. Tin oxide may be exposed prior to this etch or may become exposed during the course of tin oxide etching. For example, titanium oxide may be a spacer material that coats tin oxide mandrels. Titanium oxide spacer material may be removed from horizontal surfaces using a chlorine-based etch without completely removing titanium oxide at the sidewalls of the tin oxide mandrels.

Fluorocarbon-Based Etch.

In some embodiments silicon-containing compounds such as $SiO_2$, SiN, SiC, SiOC, SiCN, SiON, SiCNO, spin on glass are selectively etched in a presence of tin oxide using a fluorocarbon-based etch. Fluorocarbon-based etch involves exposing the silicon-containing compounds to plasma-activated fluorocarbons ($C_xF_y$) such that they are converted to volatile compounds containing Si—F bonds. Examples of suitable fluorocarbon reactants include $CF_4$, $C_2F_6$ and the like. Fluorocarbon-based etching involves, in one implementation, forming a plasma in a process gas containing a fluorocarbon, and, optionally, an inert gas, and contacting the substrate with the formed plasma. Fluorocarbon etch can selectively remove silicon-containing compounds in a presence of tin oxide. In some embodiments a semiconductor substrate is provided, where the semiconductor substrate includes an exposed layer of a silicon-containing compound (e.g., a silicon-containing spacer material or ESL material) and a layer of tin oxide (e.g., a tin oxide mandrel). Next, the substrate is contacted with a fluorocarbon plasma and the silicon-containing compound is selectively etched in a presence of tin oxide. In one embodiment, the substrate includes tin oxide mandrels coated with a silicon-containing spacer material (e.g., silicon oxide) both on the horizontal surfaces of the mandrel and at the mandrel sidewalls. The silicon-containing spacer material is selectively etched and is removed by a fluorocarbon-based etch chemistry from the horizontal surfaces, such that the silicon-based spacer material remains at the sidewalls of the mandrels. Tin oxide may be exposed prior to this etch or may become exposed during the course of etching. Fluorocarbon-based etch is a type of a fluorine-based etch.

Fluorine-Based Etch.

In some embodiments elemental silicon and silicon-containing compounds such as $SiO_2$, SiN, SiC, SiOC, SiCN, SiON, SiCNO, and spin on glass are selectively etched in a presence of tin oxide using a fluorine-based etch. Fluorine-based etch involves exposing the silicon-containing material to a fluorine-containing reagent (e.g., $NF_3$, $SF_6$, or a fluorocarbon), which is in some embodiments plasma-activated, and converting the silicon-containing material to a volatile silicon fluoride. Tin oxide, however, does not form a volatile fluoride and therefore is not substantially etched by this chemistry. In addition to silicon-containing materials, titanium oxide, tungsten, and tungsten carbon can be selectively etched in a presence of tin oxide using fluorine-based etches. Fluorine-based etching involves, in one implementation, forming a plasma in a process gas containing a fluorine-containing reactant (e.g., $NF_3$), and, optionally, an inert gas, and contacting the substrate with the formed plasma. Fluorine-based etch can selectively remove silicon-containing compounds and elemental silicon in a presence of tin oxide. In some embodiments a semiconductor substrate is provided, where the semiconductor substrate includes an exposed layer of a silicon-containing compound and/or a layer of elemental silicon (Si) (e.g., as a spacer material or as an ESL material) and a layer of tin oxide (e.g., as a mandrel material). Next, the substrate is contacted with a fluorine-containing reactant in a plasma and the silicon-containing compound and/or Si is selectively etched in a presence of tin oxide. Tin oxide may be exposed prior to this etch or may become exposed during the course of etching.

In one implementation silicon (Si) is selectively etched in a presence of tin oxide using a fluorine-based etch. In one implementation, this etching method involves flowing $NF_3$ at a flow rate of 5-100 sccm, $Cl_2$ at a flow rate of 50-500 sccm and an inert gas (e.g., nitrogen and/or helium) at a flow rate of 100-500 sccm and forming a plasma in this process gas using RF power of 100-1000 W (per one 300 mm wafer) corresponding to power densities of 0.14-1.4 W/cm$^2$. This etch can be conducted with or without a substrate bias. For example, substrate bias may be between 0-100 Vb, such as 10-100 Vb. The process can be performed at a temperature of less than 100° C. and a pressure of 10-300 mTorr.

In some embodiments a semiconductor substrate is provided, where the semiconductor substrate includes an exposed layer of a titanium oxide, tungsten, and/or tungsten carbon (e.g., as a layer of spacer material) and a layer of tin oxide (e.g., as a mandrel material). Next, the substrate is contacted with a fluorine-containing reactant in a plasma and titanium oxide, tungsten, and/or tungsten carbon is selectively etched in a presence of tin oxide. Tin oxide may be exposed prior to this etch or may become exposed during the course of etching.

In one implementation titanium oxide is selectively etched in a presence of tin oxide using a fluorine-based etch. In one implementation, this etching method involves flowing $CF_4$ at a flow rate of 5-500 sccm, $CHF_3$ at a flow rate of 0-500 sccm (e.g., 10-500 sccm) and an inert gas (e.g., argon) at a flow rate of 100-500 sccm and forming a plasma in this process gas using RF power of 500-1000 W (per one 300 mm wafer) corresponding to power densities of 0.71-1.4 W/cm$^2$. This etch can be conducted with or without a substrate bias. For example, substrate bias may be between 0-300 Vb, such as 10-300 Vb. The process can be performed at a temperature of less than 100° C. and a pressure of 5-50 mTorr.

In one implementation tungsten carbon is selectively etched in a presence of tin oxide using a fluorine-based etch. In one implementation, this etching method involves flowing $NF_3$ at a flow rate of 5-100 sccm, $Cl_2$ at a flow rate of 5-500 sccm and an inert gas (e.g., argon and/or nitrogen) at a flow rate of 100-500 sccm and forming a plasma in this process gas using RF power of 100-1000 W (per one 300 mm wafer) corresponding to power densities of 0.14-1.4 W/cm$^2$. This etch can be conducted with or without a substrate bias. For example, substrate bias may be between 0-100 Vb, such as 10-100 Vb. The process can be performed at a temperature of less than 100° C. and a pressure of 10-100 mTorr.

Oxygen-Based Etch.

In some embodiments one or more materials selected from the group consisting of elemental carbon, carbon-containing compounds, polymers, and photoresist is selectively etched in a presence of tin oxide using an oxygen-based etch. Oxygen-based etch involves exposing any of the materials listed above to an oxygen-containing reagent (e.g., $O_2$, $O_3$, $SO_2$, or $CO_2$), which is in some embodiments plasma-activated, and converting the material to a volatile product containing carbon-oxygen bond (e.g., CO or $CO_2$). Oxygen-based etching involves, in one implementation, forming a plasma in a process gas containing an oxygen-containing reactant (e.g., $O_2$), and, optionally, an inert gas, and contacting the substrate with the formed plasma. In other embodiments etching may occur in an absence of plasma. Oxygen-based etch can selectively remove carbon (e.g., amorphous or diamond-like carbon), carbon-containing compounds, and photoresist in a presence of tin oxide. In some embodiments a semiconductor substrate is provided, where the semiconductor substrate includes an exposed layer of one or more materials selected from the group consisting of carbon, a carbon-containing compound and a photoresist (e.g., as a spacer material), and a layer of tin oxide (e.g., as a mandrel material). Next, the substrate is contacted with an oxygen-containing reactant (optionally activated in a plasma) to convert carbon-containing materials to volatile CO or $CO_2$ thereby selectively etching them in a presence of tin oxide. Tin oxide may be exposed prior to this etch or may become exposed during the course of etching. For example, oxygen-based etch can be used to remove spacer material (e.g., a carbon-containing material, such as photoresist) from horizontal surfaces such that spacer material residing at the sidewalls of tin oxide mandrels is not fully removed, and such that tin oxide is exposed by the etch.

Deposition of Materials.

Materials that are referenced herein can be deposited using a variety of deposition methods, such as CVD (which includes PECVD), ALD (which includes PEALD), PVD (e.g., for deposition of metals and metal oxides), spin-on methods (e.g., for deposition of carbon, and some dielectrics). When conformal deposition is needed, ALD methods are typically preferred.

$SiO_2$, SiC, SiN, SiOC, SiNO, SiCNO, and SiCN materials can be deposited using a variety of methods, such as CVD, PECVD and ALD. The deposition can include a reaction between a silicon-containing precursor and a reactant (e.g., an oxygen-containing reactant, a nitrogen-containing reactant, or a carbon-containing reactant). A variety of silicon-containing precursors can be used for deposition of these materials, including silane, tetraalkylsilanes, trialkylsilanes, tetraethylorthosilicate (TEOS), etc. For example, $SiO_2$ may be deposited using TEOS or silane as the silicon-containing precursor.

Carbon can be deposited by a CVD or PECVD method by using, for example, a hydrocarbon precursor (e.g., $CH_4$). In other implementations carbon may be deposited by spin-on methods or by PVD. Photoresist and organic polymers can be deposited, for example, by spin on methods.

The tin oxide layer is deposited by any suitable method such as by CVD (including PECVD), ALD (including PEALD), sputtering, etc. In some embodiments, it is preferable to deposit the $SnO_2$ film conformally, such that it follows the surface of the substrate, including the surfaces of any protrusions and recessed features on the substrate. One of the suitable deposition methods of conformal $SnO_2$ film is ALD. Thermal or plasma enhanced ALD can be used. In a typical thermal ALD method, the substrate is provided to an ALD process chamber and is sequentially exposed to a tin-containing precursor, and an oxygen-containing reactant, where the tin-containing precursor and the oxygen containing reactant are allowed to react on the surface of the substrate to form $SnO_2$. The ALD process chamber is typically purged with an inert gas after the substrate is exposed to the tin-containing precursor, and before the oxygen-containing reactant is admitted to the process chamber to prevent reaction in the bulk of the process chamber. Further, the ALD process chamber is typically purged with an inert gas after the substrate has been treated with the oxygen-containing reactant. The sequential exposure is repeated for several cycles, e.g., between about 10-100 cycles can be performed until the tin oxide layer having a desired thickness is deposited. Examples of suitable tin-containing precursors include halogenated tin-containing precursors (such as $SnCl_4$, and $SnBr_4$), and non-halogenated tin-containing precursors, such as organotin compounds, which include alkyl substituted tin amides and the like. Specific examples of alkyl substituted tin amides that are suitable for ALD are tetrakis(dimethylamino) tin, tetrakis (ethylmethylamino) tin, $N^2,N^3$-di-tert-butyl-butane-2,3-di-amino-tin(II) and (1,3-bis(1,1-dimethylethyl)-4,5-dimethyl-(4R,5R)-1,3,2-diazastannolidin-2-ylidene. Oxygen-containing reactants include without limitation oxygen, ozone, water, hydrogen peroxide, and NO. Mixtures of oxygen-containing reactants can also be used. The deposition conditions will vary depending on the choice of ALD reactants, where more reactive precursors will generally react at lower temperatures than less reactive precursors. The processes typically will be carried out at a temperature of between about 20-500° C., and at a sub-atmospheric pressure. The temperature and pressure are selected such that the reactants remain in the gaseous form in the process chamber to avoid condensation. Each reactant is provided to the process chamber in a gaseous form either alone or mixed with a carrier gas, such as argon, helium, or nitrogen. The flow rates of these mixtures will depend on the size of the process chamber, and are in some embodiments between about 10-10,000 sccm.

In one example the ALD process includes sequentially and alternately exposing the substrate in an ALD vacuum chamber to $SnCl_4$ (the tin-containing precursor) and deionized water (the oxygen-containing reactant) at a temperature of 200-400° C. In a specific example of an ALD cycle, a mixture of $SnCl_4$ vapor with $N_2$ carrier gas is introduced into the ALD process chamber for 0.5 seconds, and is then exposed to the substrate for 3 seconds. Next the ALD process chamber is purged with $N_2$ for 10 seconds to remove $SnCl_4$ from the bulk of the process chamber, and a mixture of $H_2O$ vapor with $N_2$ carrier gas is flowed into the process chamber for 1 second and is exposed to the substrate for 3 seconds. Next, the ALD process chamber is purged with $N_2$ and the cycle is repeated. The ALD process is performed at subatmospheric pressure (e.g., 0.4 Torr) and at a temperature of 200-400° C.

While the use of halogenated tin precursors in ALD is suitable in many embodiments, in some embodiments it is more preferable to use non-halogenated organotin precursors to avoid corrosion problems that may occur with the use of halogenated precursors such as $SnCl_4$. Examples of suitable non-halogenated organotin precursors include alkylaminotin (alkylated tin amide) precursors, such as tetrakis (dimethylamino) tin. In one example of an ALD process the substrate is sequentially exposed in an ALD chamber to tetrakis(dimethylamino) tin and $H_2O_2$ at a temperature of between about 50-300° C. Advantageously, the use of this precursor allows deposition of $SnO_2$ films at low temperatures of 100° C. or less. For example, $SnO_2$ films can be deposited at 50° C. without the use of plasma to enhance reaction rate.

In some embodiments, $SnO_2$ films are deposited by PEALD. The same types of tin-containing precursors and oxygen-containing reactants as described above for thermal ALD can be used. In PEALD the ALD apparatus is equipped with a system for generating plasma in the process chamber, and for treating the substrate with the plasma. In a typical PEALD process sequence, the substrate is provided to the PEALD process chamber and is exposed to the tin-containing precursor which adsorbs on the surface of the substrate. The process chamber is purged with an inert gas (e.g., argon or helium) to remove the precursor from the process chamber, and the substrate is exposed to an oxygen-containing reactant which is introduced into the process chamber. Concurrently with the introduction of the oxygen-containing reactant or after a delay, plasma is formed in the process chamber. The plasma facilitates the reaction between the tin-containing precursor and the oxygen-containing reactant on the surface of the substrate that results in formation of tin oxide. Next, the process chamber is purged with an inert gas, and the cycle comprising tin precursor dosing, purging, oxygen-containing reactant dosing, plasma treatment, and second purging is repeated as many times as necessary to form a tin oxide film of desired thickness.

Tin Oxide as a Mandrel

Figure 1B:
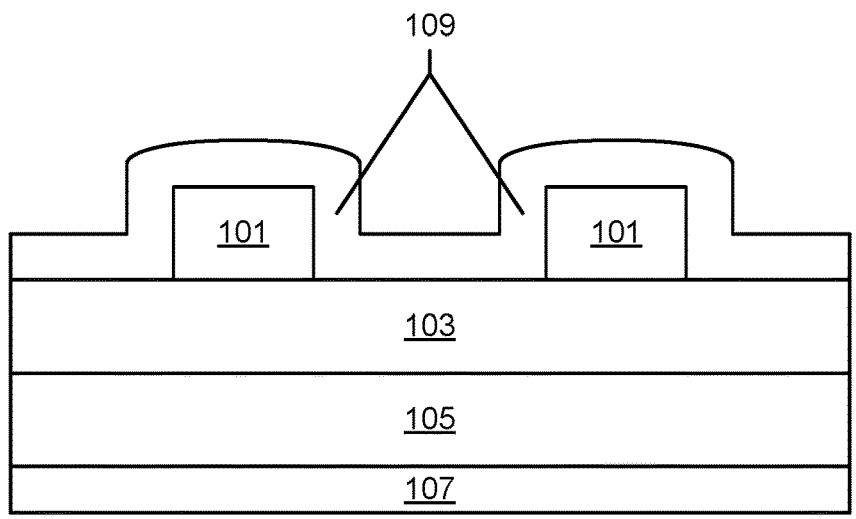
Figure 1C:
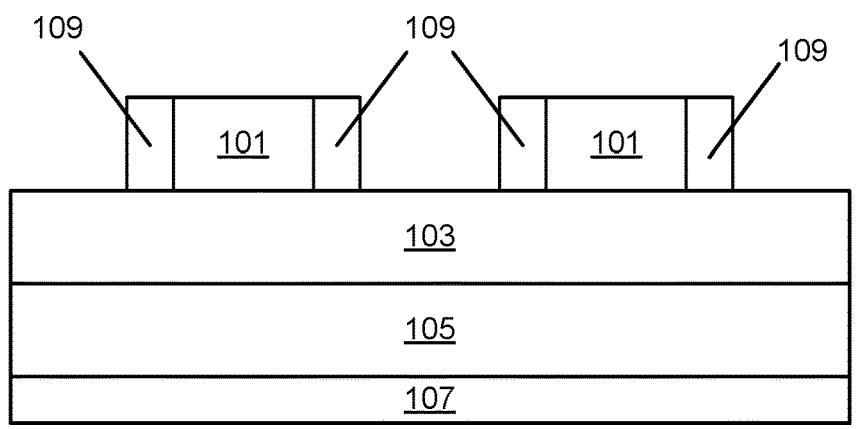
Figure 1D:
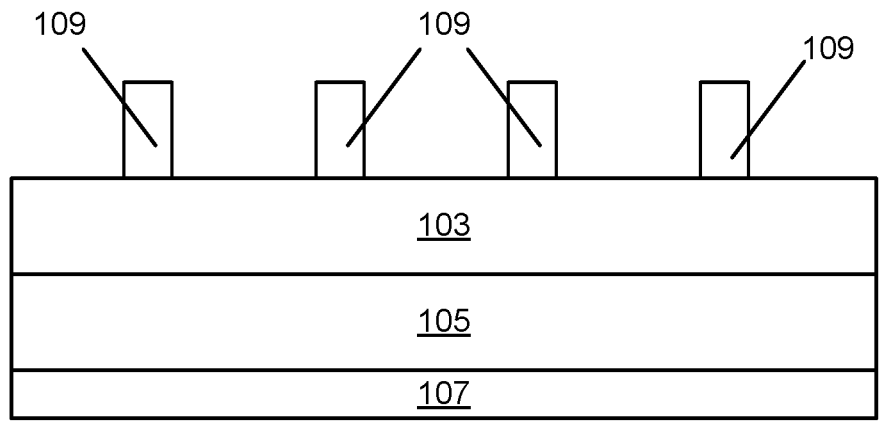
Figure 1E:
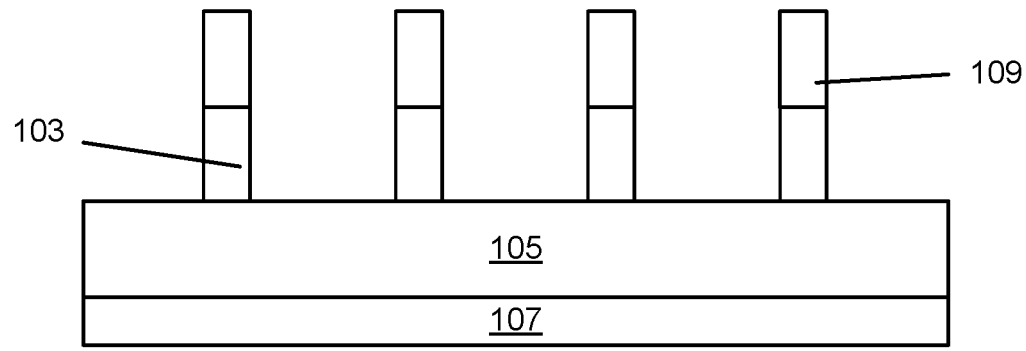
Figure 1F:
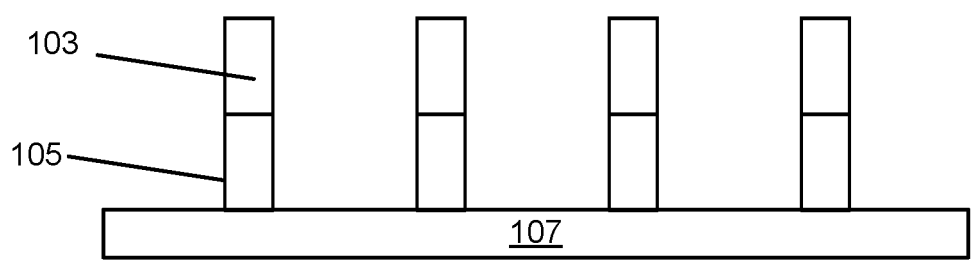
Figure 2:
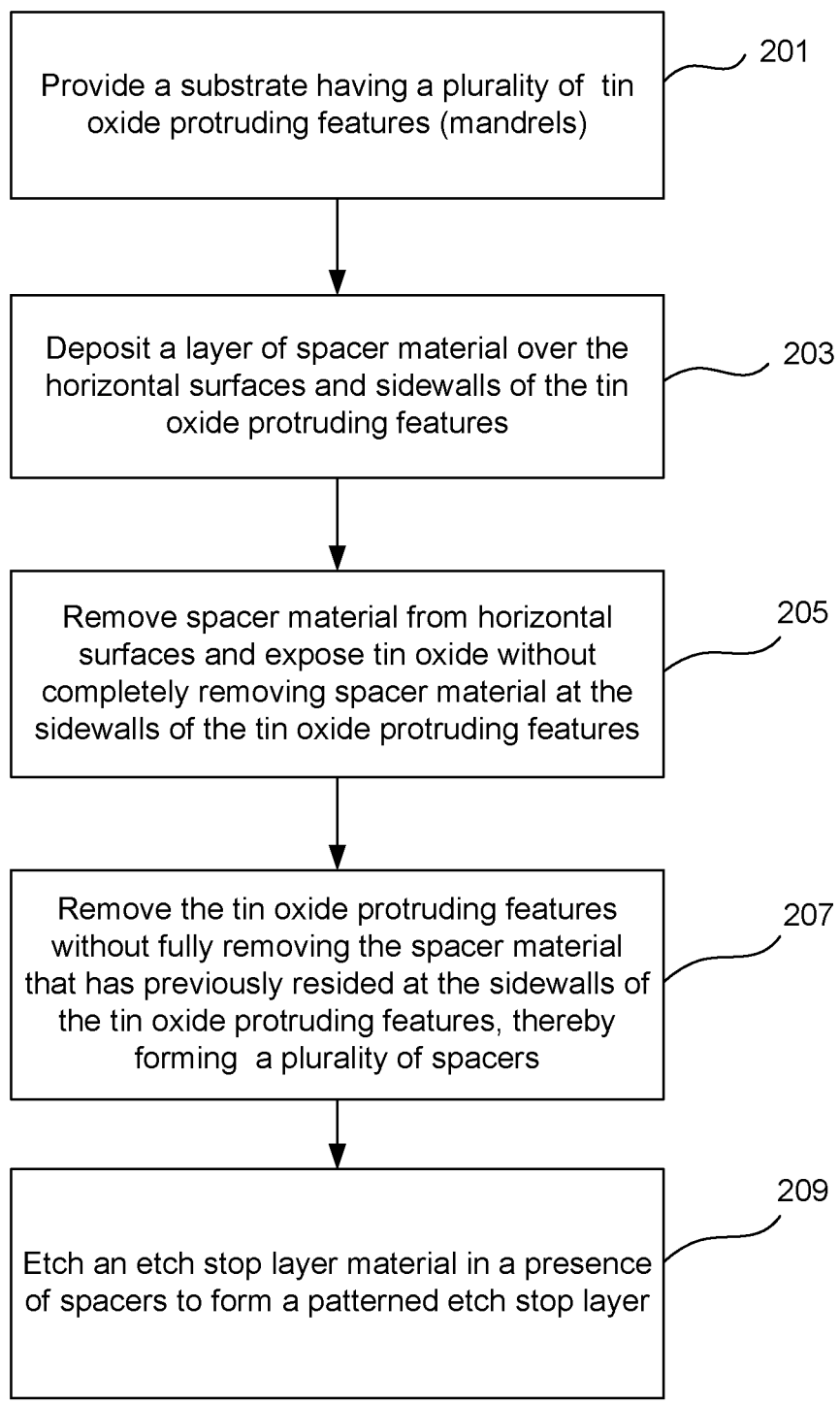
FIG. 2 is a process flow diagram for a method according to an embodiment provided herein.

In the provided implementations tin oxide layers are used as mandrels. The use of tin oxide mandrels is illustrated with reference to FIGS. 1A-1F, which provide schematic cross-sectional views of a semiconductor substrate at different stages of processing. FIG. 2 provides a process flow diagram for an embodiment of these methods.

Referring to FIG. 2, the process starts in 201, by providing a substrate having a plurality of tin oxide protruding features. An illustrative substrate is shown in FIG. 1A, which shows two tin oxide mandrels 101 residing on an etch stop layer (ESL) 103. The distance d1 between the neighboring mandrels is, in some embodiments, between about 10-100 nm. In some embodiments relatively larger distances of about 40-100 nm are used. In other applications, the distance between closest mandrels is between about 10-30 nm. The distance between the centers of closest mandrels, d2, which is also referred to as pitch, is, in some embodiments, between about 30-130 nm. In some embodiments, the pitch is between about 80-130 nm. In other embodiments, the pitch is between about 30-40 nm. The height of the mandrels d3 is typically between about 20-200 nm, such as between about 50-100 nm.

The materials of the mandrel and of the ESL are selected preferably such as to allow subsequent selective etching of the tin oxide mandrel material in the presence of exposed spacer material, and selective etching of the ESL material in the presence of exposed spacer material. Thus, the ratio of the etch rate of the ESL material to the etch rate of the spacer material is greater than 1, more preferably greater than about 1.5, such as greater than about 2 for an ESL etch chemistry. Similarly, the ratio of the etch rate of the tin oxide mandrel material to the etch rate of the spacer material is greater than 1, more preferably greater than about 1.5, such as greater than about 2 for a mandrel pull chemistry.

In some embodiments the ESL material is a silicon-containing compound (e.g., $SiO_2$), or a metal oxide (e.g., titanium oxide, zirconium oxide, or tungsten oxide). The mandrel material is tin oxide and the spacer material may include silicon-containing compound (e.g., $SiO_2$, SiN, or SiC), a carbon-containing compound (e.g., amorphous carbon, diamond-like carbon or photoresist), amorphous silicon (doped or undoped) or a metal oxide (TaO, TiO, WO, ZrO, HfO). The ESL material, the mandrel material and the spacer material are selected to be all different. In some embodiments the outer material of the mandrel may be different from the mandrel core. The ESL layer and the mandrels can be formed by one or more of physical vapor deposition (PVD), chemical vapor deposition (CVD), ALD (without plasma or by PEALD) or plasma enhanced chemical vapor deposition (PECVD) and the pattern of the mandrels can be defined using photolithographic techniques or using an SAQP-type method described herein. The material for the spacers is selected preferably such that it is possible to etch it selectively relative to tin oxide using a spacer etch chemistry and such that it is possible to etch tin oxide mandrels selectively relative to the spacer material using the mandrel pull chemistry. The ESL material is selected, in some embodiments, such that it is possible to etch ESL selectively relative to spacer material using ESL etch chemistry.

In some embodiments, spacer materials that are used in combination with the tin oxide mandrels include without limitation silicon oxide, silicon nitride, or titanium oxide. Other suitable spacer materials that can be used in this embodiment include SiC, SiOC, SiNO, SiCNO, and SiCN. Examples of suitable ESL and spacer material pairs that can be used in combination with tin oxide mandrels include: (i) titanium oxide spacer and silicon oxide ESL; (ii) silicon oxide spacer and tungsten ESL; (iii) silicon oxide spacer and a silicon carbide ESL.

Referring again to the substrate shown in FIG. 1A, the ESL layer 103 resides over and in contact with the target layer 105. The target layer 105 is the layer that needs to be patterned. The target layer 105 may be a semiconductor, dielectric or other layer and may be made of silicon (Si), silicon oxide ($SiO_2$), silicon nitride (SiN), or titanium nitride (TiN), for example. In some embodiments the target layer is referred to as a hardmask layer and includes metal nitride, such as titanium nitride. The target layer 105 may be deposited by ALD (without plasma or by PEALD), CVD, or other suitable deposition technique. The target layer 105 resides over and in contact with layer 107, which is in some embodiments a BEOL layer, that includes a plurality of metal lines embedded into a layer of dielectric material.

Referring again to FIG. 2, the process follows in 203 by depositing a layer of spacer material over both the horizontal surfaces and sidewalls of the protruding features. Referring to the structure shown in FIG. 1B, the spacer material layer 109 is deposited over the ESL 103, and over the tin oxide mandrels 101, including the sidewalls of the mandrels. The spacer material layer is deposited by any suitable method such as by CVD (including PECVD), ALD (including PEALD), sputtering, etc. In some embodiments it is preferable to deposit the spacer material film conformally, such that it follows the surface of the ESL 103 and the tin oxide mandrels 101, as shown in FIG. 1B. Conformal films as used herein generally follow the contour of the substrate. The thickness of the conformal film in some embodiments is about the same (with a fluctuation of less than 50%) on all (horizontal and vertical) surfaces. In some embodiments the fluctuation of thickness in the deposited conformal film is less than 15%. In other embodiments the thickness of the conformal film can be significantly greater on horizontal surfaces than on the sidewalls. In some embodiments the spacer material layer is deposited conformally to a thickness of between about 5-30 nm, such as between about 10-20 nm. Generally, the spacer material layer 109 is deposited by any suitable method such as by CVD (including PECVD), ALD (including PEALD), sputtering, etc. For example, the spacer material may be a PECVD-deposited or an ALD-deposited layer of any of silicon oxide, silicon nitride, or titanium oxide. In one implementation the spacer material is an ALD-deposited titanium oxide and the ESL is silicon oxide or another silicon-containing material. Other examples of spacer material that can be deposited by PECVD or ALD include SiC, SiOC, SiNO, SiCNO, and SiCN.

Referring to the process diagram of FIG. 2, after the spacer material layer has been deposited, the process follows in 205 by removing the spacer material from the horizontal surfaces, without completely removing the spacer material at the sidewalls of the tin oxide protruding features. This step is performed using a spacer etch chemistry. The spacer material is removed from the horizontal surfaces such that the tin oxide mandrel 101 material and the ESL 103 are exposed as shown in FIG. 1C, while the spacer material 109 at the sidewalls of the mandrel 101 is not completely removed. The spacer etch chemistry is preferably selective to both tin oxide mandrels and the ESL material. When the spacer is silicon-based, such as $SiO_2$, SiN or any of SiC, SiOC, SiNO, SiCNO, and SiCN, a fluorine-based etch may be used. For example, a plasma fluorocarbon etch chemistry can be used to selectively etch the silicon-containing spacer relative to the tin oxide mandrel. The chemistry can be tuned depending on the type of ESL used. When the spacer is titanium oxide it can be selectively etched relative to both tin oxide mandrel and silicon oxide ESL using a chlorine-based chemistry. Chlorine-based etch chemistry includes exposing the substrate to a reactant containing Cl (typically plasma activated), such as plasma-activated $Cl_2$, $BCl_3$, etc. When the spacer is silicon-based (e.g., $SiO_2$, SiN, or any of SiC, SiOC, SiNO, SiCNO, and SiCN) and the ESL is tungsten, the spacer can be selectively etched relative to both tin oxide and tungsten using an flurione-based etch chemistry, such as $SF_6/O_2$ mixture activated by plasma.

Removal of the spacer material from horizontal surfaces is illustrated by FIG. 1C. The spacer material layer 109 is etched from the horizontal surfaces over ESL 103 and over mandrels 101, without being fully etched from positions that adhere to the sidewalls of the tin oxide mandrels 101. This etch exposes the layer 103 everywhere with the exception of locations near the sidewalls of the tin oxide mandrels 101. Further, this etch exposes the top portions of the tin oxide mandrels 101. The resulting structure is shown in FIG. 1C. Preferably after this etch at least 50%, such as at least 80% or at least 90% of the initial height of the tin oxide layer at the sidewall is preserved.

Referring to the process shown in FIG. 2, after the spacer material has been removed from horizontal surfaces in 205, in the next operation 207, the tin oxide protruding features are removed without fully removing the spacer material that has previously resided at the sidewalls of the protruding features (mandrels), thereby forming a plurality of spacers. The resulting structure is shown in FIG. 1D, which shows a plurality of spacers 109 residing on the ESL 103 after the tin oxide mandrels 101 have been removed. Removal of the mandrels is performed by exposing the substrate to an etch chemistry that selectively etches the mandrel material (mandrel pull chemistry). Thus, the ratio of the etch rate of the tin oxide mandrel material to the etch rate of the spacer material in this step is greater than 1, and is more preferably greater than 1.5. Further, the etch chemistry used in this step should, in some embodiments, selectively etch the tin oxide mandrel material relative to ESL material. A variety of etching methods can be used, and specific choice of chemistry depends on the material of the spacer and on the material of the ESL layer. Next, the tin oxide mandrels 101 are removed using a mandrel pull chemistry. In some embodiments tin oxide mandrels are removed using a hydrogen-based etch. For example, in some embodiments, the substrate is contacted with a plasma activated hydrogen-containing gas, such as a gas including $H_2$, HBr, $NH_3$, a hydrocarbon, $H_2O$, or a combination thereof, to form a volatile tin hydride, which can be easily removed from the process chamber. Hydrogen-based etch is selective to a wide variety of spacer materials including $SiO_2$, SiN or any of SiC, SiOC, SiNO, SiCNO, SiCN, and $TiO_2$ and ESL layer of metal (e.g., W) or metal-containing dielectrics including, $WO_2$, TiN, TaN, ZrO, HfO. In alternative embodiments other types of tin oxide etch chemistries, provided herein, may be used.

Referring to FIG. 2, after the spacers have been formed, in operation 209 the ESL material is etched in the presence of spacers resulting in a formation of the patterned ESL. This step is performed using an ESL etch chemistry. The resulting structure is shown in FIG. 1E, where it is illustrated that the exposed ESL 103 was etched to expose the underlying target layer 105 at all positions that are not protected by the spacers 109. The ESL etch chemistry that is used in this step, in some embodiments, selectively etches the ESL material in the presence of spacer material. In other words, in some embodiments, the ratio of the etch rate of the ESL material to the etch rate of the spacer material is greater than 1, and is more preferably greater than 1.5 for the ESL etch chemistry. When the spacer material is $TiO_2$ and the ESL material is a silicon-based material, such as $SiO_2$, SiN, or any of SiC, SiOC, SiNO, SiCNO, and SiCN, an fluorine-based etch (e.g., fluorocarbon plasma etch chemistry) can be used to selectively etch the ESL layer in a presence of $TiO_2$.

After the pattern defined by the spacers has been transferred to the ESL, the target layer 105 is etched at all positions that are not protected by the ESL film 103, to expose the underlying layer 107. The spacers 109 can also be removed in this etching step providing a patterned structure shown in FIG. 1F. In some embodiments, the etch chemistry used in this step is selected to remove both the target material and the spacer material. In other embodiments, two different etching steps with different chemistries can be used to pattern the target layer 105 and to remove the spacers 109 respectively. A number of etching chemistries can be used depending on the chemistry of the target layer. In one embodiment the target layer 105 is a metal nitride layer (e.g., a TiN) layer. For example a titanium nitride target layer material can be etched using a chlorine-based etch chemistry. If spacer material is $TiO_2$, the spacers can be removed by a chlorine-based etch concurrently with the target layer etching.

Formation of Tin Oxide Mandrels.

Figure 3:
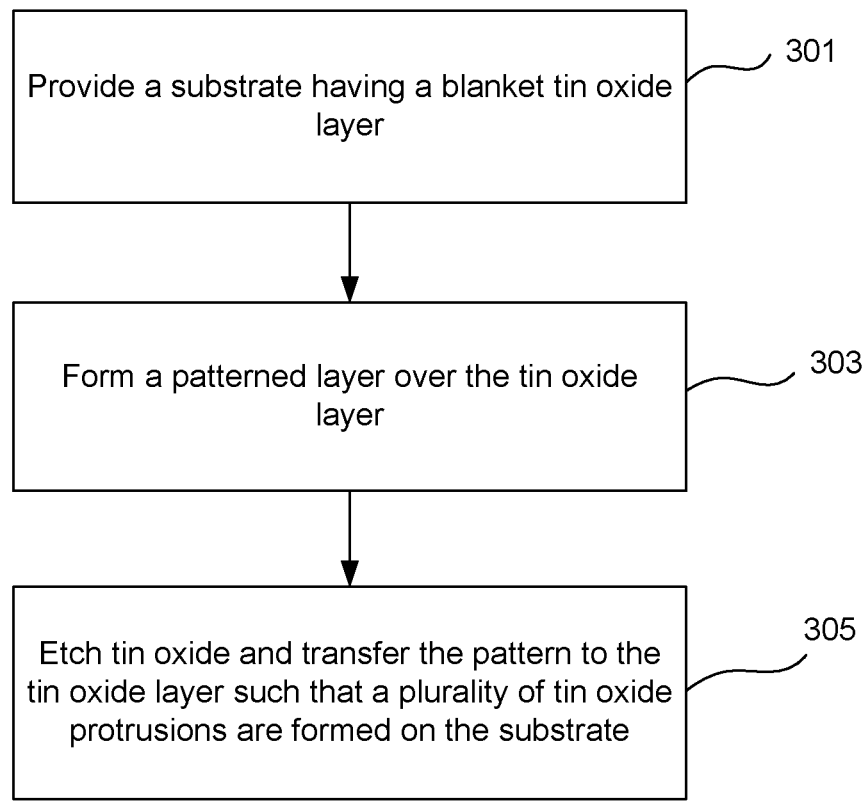
FIG. 3 is a process flow diagram for a method of forming tin oxide mandrels according to an embodiment provided herein.

Substrates having tin oxide mandrels can be formed using several distinct methods. In some embodiments, the tin oxide mandrels are formed by patterning a blanket layer of tin oxide. This is illustrated by a process flow diagram shown in FIG. 3. The process starts in operation 301 by providing a substrate having a blanket tin oxide layer. For example tin oxide can be deposited over the substrate having a planar exposed ESL, to form a planar layer of tin oxide over the ESL. Next, in operation 303, a patterned layer is formed over the tin oxide layer. For example, a blanket layer of photoresist may be deposited over the tin oxide (but not necessarily in direct contact with tin oxide), and may be patterned using photolithographic techniques. In some embodiments one or more intermediate blanket layers are deposited between the tin oxide layer and the photoresist layer. Next, in operation 305 tin oxide is etched and a pattern is transferred to the tin oxide layer such that a plurality of tin oxide protrusions are formed on a substrate. If there are intermediate layers between the tin oxide layer and the photoresist, the pattern is first transferred to these intermediate layers. In some embodiments the tin oxide is etched by a hydrogen-based etch chemistry in a presence of a patterned layer of a masking material, such as photoresist, carbon, another carbon-containing material, and/or a silicon-containing material.

Figure 4A:
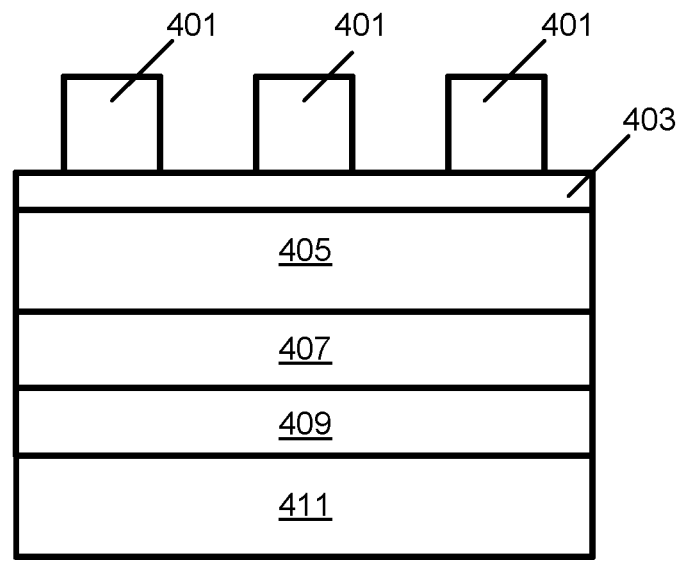
FIGS. 4A-4E show schematic cross-sectional views of a semiconductor substrate undergoing processing to form tin oxide mandrels according to an embodiment provided herein.
Figure 4B:
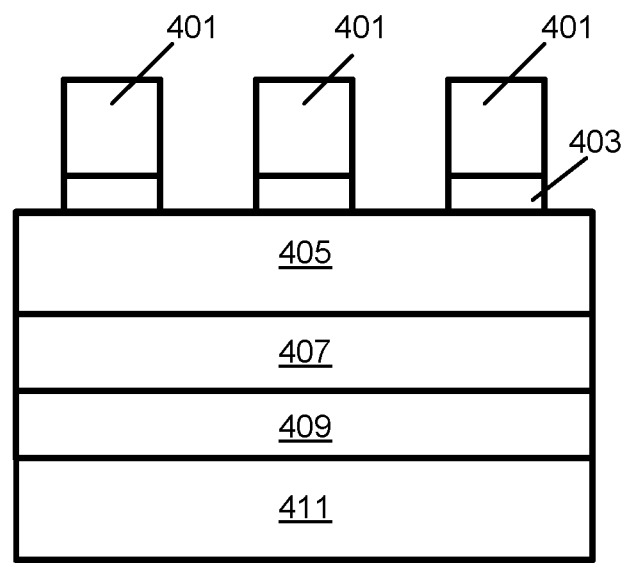
Figure 4C:
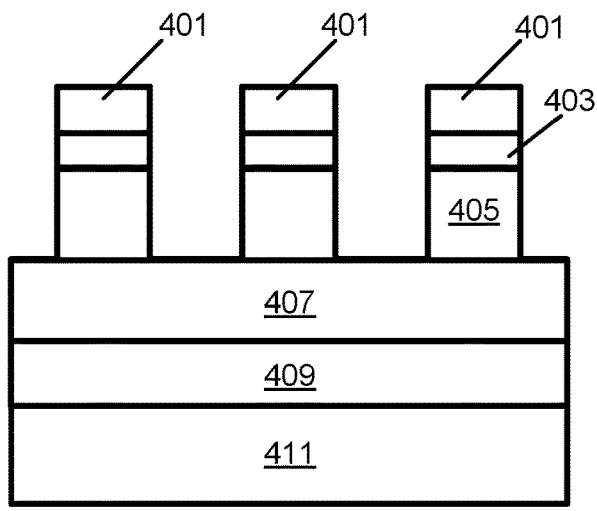
Figure 4D:
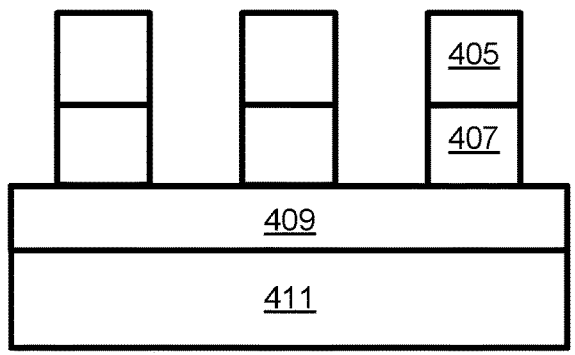
Figure 4E:
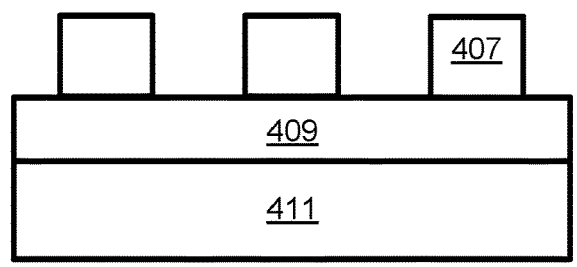

An exemplary method of forming a substrate with patterned tin oxide mandrels is shown in FIGS. 4A-4E depicting schematic cross-sectional views of a semiconductor substrate during processing. The patterning starts by providing a structure that includes a patterned layer of photoresist 401 formed on a stack of blanket layers, where the stack includes from top to bottom: a layer of spin on glass 403 (or another silicon-containing material, such as silicon oxide based material or a SiON layer deposited by low temperature CVD), a layer of spin on carbon or PECVD deposited amorphous carbon 405, a layer of tin oxide 407 (e.g., deposited by ALD, PECVD or sputtering), an ESL (e.g., silicon oxide) 409 and a target layer 411 (e.g., titanium nitride). First, the spin on glass layer (or another silicon-containing material) is etched e.g., by a fluorine-based etch (e.g., fluorocarbon-based etch chemistry). This etch transfers the pattern of photoresist to the spin on glass layer 403. The resulting structure is shown in FIG. 4B. Next, after carbon layer 405 has been exposed, carbon is etched using, for example, an oxygen-based chemistry (e.g., $O_2$, $O_3$, NO, $SO_2$, COS, CO, $CO_2$ activated in a plasma) and the pattern is transferred to carbon. This step may simultaneously remove (partially or completely) photoresist 401. The formed structure having patterned layers 401, 403 and 405 with partially removed photoresist 401 is shown in FIG. 4C. Next, blanket tin oxide layer 407 is etched using any suitable tin oxide etch chemistry disclosed herein (e.g., using hydrogen-based chemistry), and the pattern is transferred to tin oxide, as shown in the structure of FIG. 4D. Finally the carbon layer 405 is ashed and removed using, for example an oxygen-based chemistry thereby providing a structure with patterned tin oxide mandrels shown in FIG. 4E.

Figure 5A:
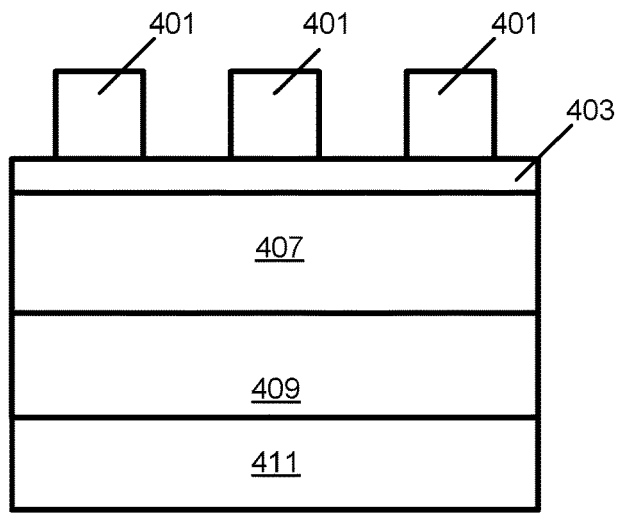
FIGS. 5A-5C show schematic cross-sectional views of a semiconductor substrate undergoing processing to form tin oxide mandrels according to an embodiment provided herein.
Figure 5B:
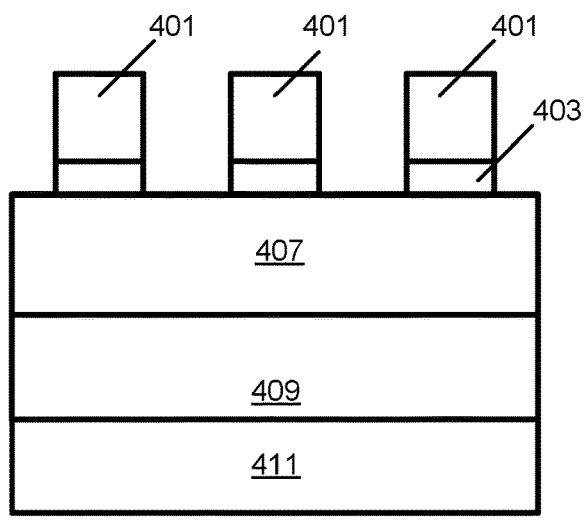
Figure 5C:
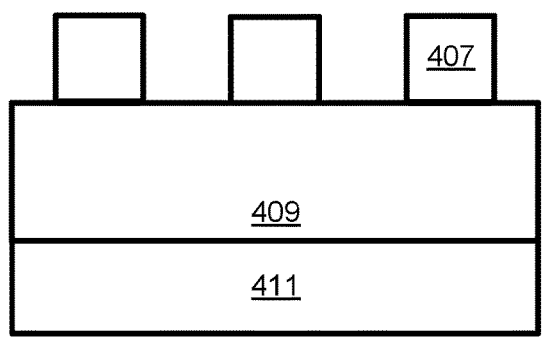

An alternative process flow is shown in FIGS. 5A-5C, which is similar to the process illustrated in FIGS. 4A-4E, but does not include the carbon hardmask 405, as shown in FIG. 5A. In this process flow the pattern of photoresist 401 is transferred to the spin on glass layer 403 as shown in FIG. 5B. Next, tin oxide layer 407 is etched and the pattern is transferred directly from the layer 403 to the tin oxide layer 407. The tin oxide can be etched with a hydrogen-based etch chemistry (e.g., using $H_2$ and/or HBr) and converting it to tin hydride, or an chlorine based chemistry (e.g., with $Cl_2$ and/or $BCl_3$). The resulting structure is shown in FIG. 5C.

Photolithographic methods that employ photoresist for patterning blanket layers involve applying the photoresist to the substrate (over blanket layers that are to be patterned); exposing the photoresist to light; patterning the photoresist and transferring the pattern to the substrate; and selectively removing the photoresist from the substrate.

Figure 6:
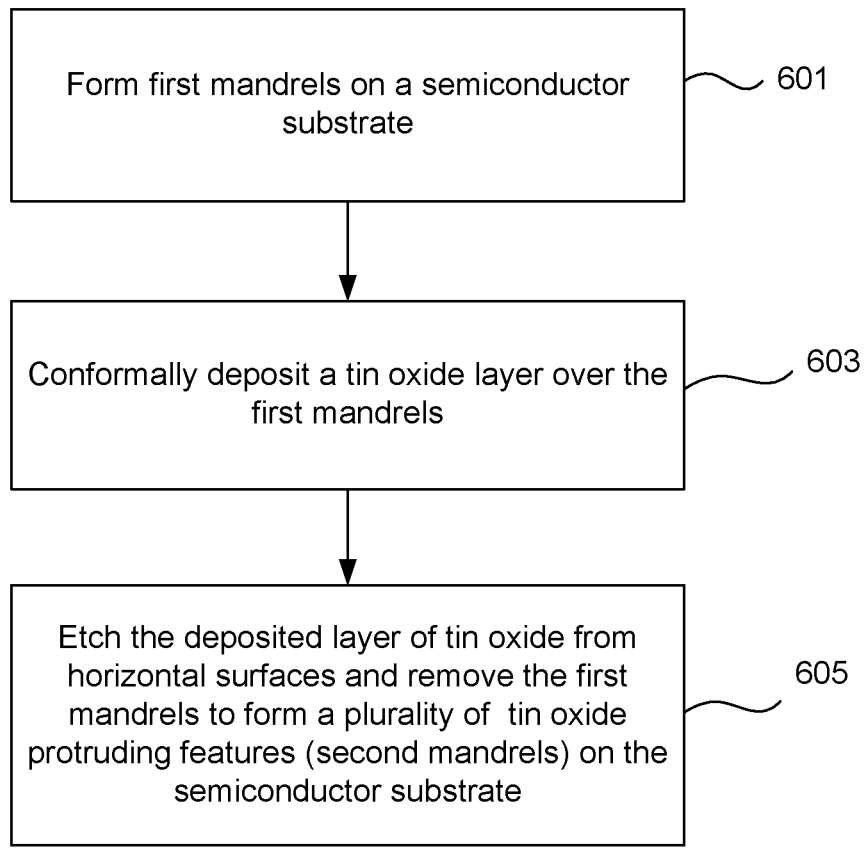
FIG. 6 is a process flow diagram for a method of forming tin oxide mandrels according to an embodiment provided herein.

In another implementation, the tin oxide mandrels are formed by an SAQP process, in which tin oxide spacers are first formed and are then used as mandrels. The process is illustrated by a process flow diagram shown in FIG. 6. The process starts in 601 by forming first mandrels on the semiconductor substrate. In one implementation the processing starts by providing a substrate having a plurality of protruding features formed over an etch stop layer material. The protruding features are the first mandrels used during patterning and can include any of the mandrel materials that can be selectively etched relative to tin oxide (e.g., photoresist, carbon, carbon-containing materials, silicon-containing materials, such as silicon and/or silicon-containing compounds, etc.). The first mandrel material is selected to be different from the etch stop layer material. In some embodiments the first mandrel is a photoresist mandrel. When the first mandrel is a photoresist mandrel, the processing can be performed with fewer steps as compared to other mandrel materials that often need to be patterned using additional lithographic steps.

In some implementations the first mandrel is photoresist and the ESL is a silicon-containing compound such as silicon oxide, silicon carbide, silicon nitride, etc. Next, in operation 603, tin oxide layer is conformally deposited over the first mandrels. The conformally deposited tin oxide layer covers both the horizontal surfaces of the first mandrels and the sidewalls of the first mandrels, as well as the exposed ESL.

In some embodiments, after the tin oxide layer has been conformally deposited and prior to removal of tin oxide from horizontal surfaces, the tin oxide residing at the mandrel sidewalls is protected using passivation methods. Passivation is performed to impede etching of tin oxide residing at the sidewalls of the mandrels during a subsequent etching step that removes tin oxide from horizontal surfaces. In some embodiments a passivation layer is formed over the tin oxide layer at the sidewalls of the first mandrels by first depositing a passivation material over both the horizontal surfaces and the sidewalls of the tin oxide-coated first mandrels, followed by removal of the passivation material from the horizontal surfaces. For example, a silicon-containing passivation material can be deposited over both the horizontal surfaces and the sidewalls of the tin oxide coated first mandrels, followed by a removal of the silicon-containing passivation material from the horizontal surfaces using a fluorine-based (e.g., fluorocarbon-based) etch chemistry. This will result in a structure where tin oxide at the sidewalls is protected by a layer of a silicon-containing passivation material prior to tin oxide etch. In another example of passivation, forming the passivation layer over the tin oxide layer at the sidewalls of the protruding features includes depositing a carbon-containing passivation material over tin oxide both at the horizontal surfaces and the sidewalls of the first mandrels, followed by removal of the carbon-containing passivation material from the horizontal surfaces. In yet another embodiment of passivation methods, forming the passivation layer over the tin oxide layer at the sidewalls of the first mandrels includes converting an outer portion of the tin oxide layer to a tin-containing passivation material, such as SnN, SnBr, SnF. In one example, an outer portion of the tin oxide layer is converted to tin nitride by contacting the substrate having an exposed tin oxide layer with a nitrogen-containing reactant in a plasma.

Next, in 605, the process follows by etching the tin oxide layer from horizontal surfaces and by subsequent removal of the first mandrels to form a plurality of tin oxide protruding features (first spacers or second mandrels). The removal of tin oxide from horizontal surfaces can be performed by any of the selective tin oxide etching chemistries described herein (e.g., by a hydrogen-based etch). The tin oxide is removed from the horizontal surfaces without fully removing the tin oxide at the sidewalls.

Next, the first mandrels are removed, without fully removing tin oxide that resided at the sidewalls of the first mandrels leaving a plurality of protruding tin oxide features (first spacers) residing on the layer of the ESL material. For example, photoresist first mandrels can be removed by an oxygen-based etch chemistry, and silicon-containing mandrels can be removed by a fluorine-based chemistry. Provided methods can be used to form tin oxide first spacers (used as second mandrels) with a desired geometry (e.g., square shape, minimal or no footing, and consistent pitch).

These protruding tin oxide features are then used as second mandrels for subsequent patterning (as in the sequence illustrated by FIG. 1A-1F. Specifically, the process follows by conformally depositing a second spacer material over the substrate such that the second spacer material covers the tin oxide second mandrels both at the sidewalls and on the horizontal surfaces. The second spacer material is selected such that it can be selectively etched relative to tin oxide mandrels. In some embodiments the second spacer material is a silicon-containing compound, such as silicon oxide. The second spacer material should be preferably different from the ESL material. The second spacer material is preferably deposited by a conformal deposition method, such as ALD. After the second spacer material has been deposited, it is removed from the horizontal surfaces without being fully removed from the positions near the sidewalls of the tin oxide mandrels. This etch can be performed by any of the etching methods that can selectively etch relative to tin oxide. For example, fluorine-based (e.g., fluorocarbon-based) plasma etches can be used if the second spacer material is a silicon-containing compound, such as silicon oxide. Next, the tin oxide second mandrels are removed without fully removing the second spacer material that resided at the sidewalls of the second mandrels. This etch can be performed by any of the etching methods that selectively etch tin oxide. In some embodiments, hydrogen-based etch is used to selectively remove tin oxide second mandrels in a presence of the second spacer material (e.g., silicon oxide). After the tin oxide mandrels are removed, the substrate contains a plurality of spacers on an etch stop layer. The number of spacers at this stage is four times the number of first mandrels (quadruple patterning). Subsequent processing can involve selective etching and removal of the exposed etch stop layer in a presence of spacers, followed by selective etching of target material or materials, and spacer removal.

Figure 7A:
FIGS. 7A-7G show schematic cross-sectional views of a semiconductor substrate undergoing processing according to an embodiment provided herein, illustrating the use of tin oxide spacers as second mandrels in a self-aligned quadruple patterning (SAQP) process.
Figure 7B:
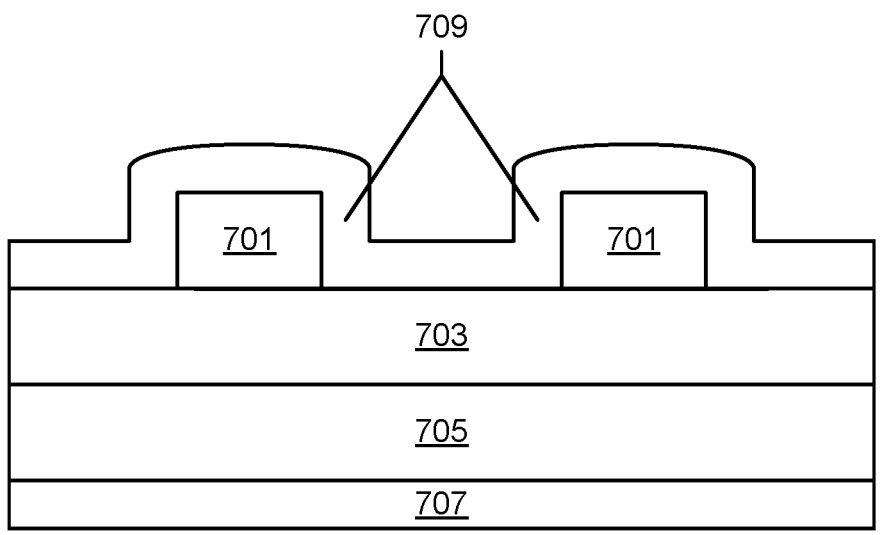

One implementation of the process sequence in which the tin oxide spacer is used as a second mandrel in a SAQP (self aligned quadruple patterning)-type implementation, is illustrated by schematic cross-sectional views of a substrate undergoing processing shown in FIGS. 7A-7G. Isometric views are shown in FIGS. 8A-8F. FIG. 7A shows a semiconductor substrate having protruding features (first mandrels) 701 residing on an etch stop layer 703. A number of layers 705 and 707 underlie the etch stop layer. These underlying layers may include the target layer that needs to be patterned and/or one or more hardmasks. In the depicted embodiment the first mandrels 701 are made of photoresist and the ESL 703 is a layer of a silicon-containing compound, such as silicon oxide, silicon nitride, silicon carbide, silicon oxynitride, etc. A conformal layer of tin oxide is deposited over the substrate providing a structure shown in FIG. 7B. The tin oxide layer 709 is deposited in this embodiment directly over photoresist mandrels 701 and ESL 705, such that it covers both the horizontal surfaces of the substrate and the surfaces of the sidewalls of the photoresist mandrels 701. The corresponding isometric view is shown in FIG. 8A.

Figure 7C:
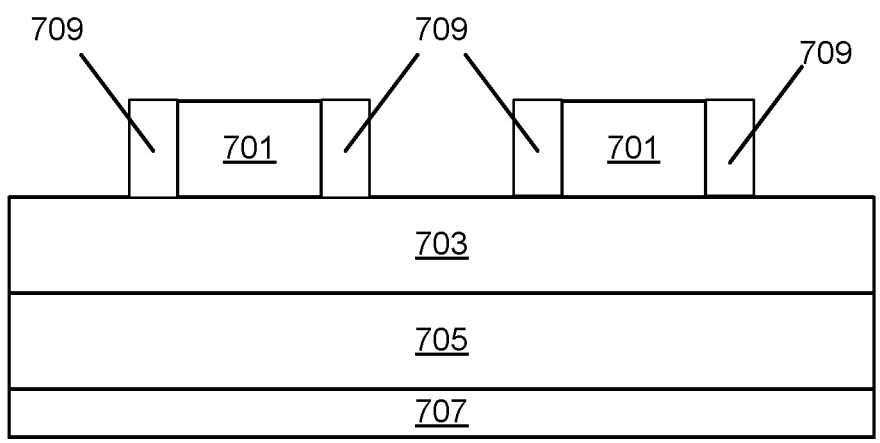
Figure 7D:
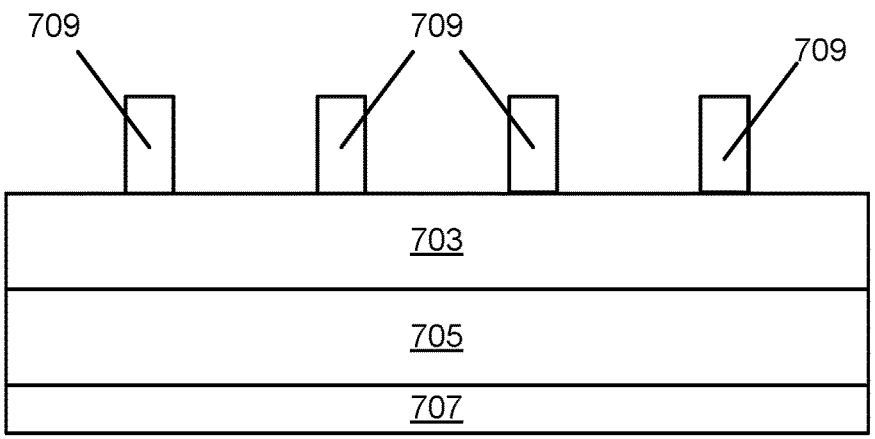
Figure 8A:
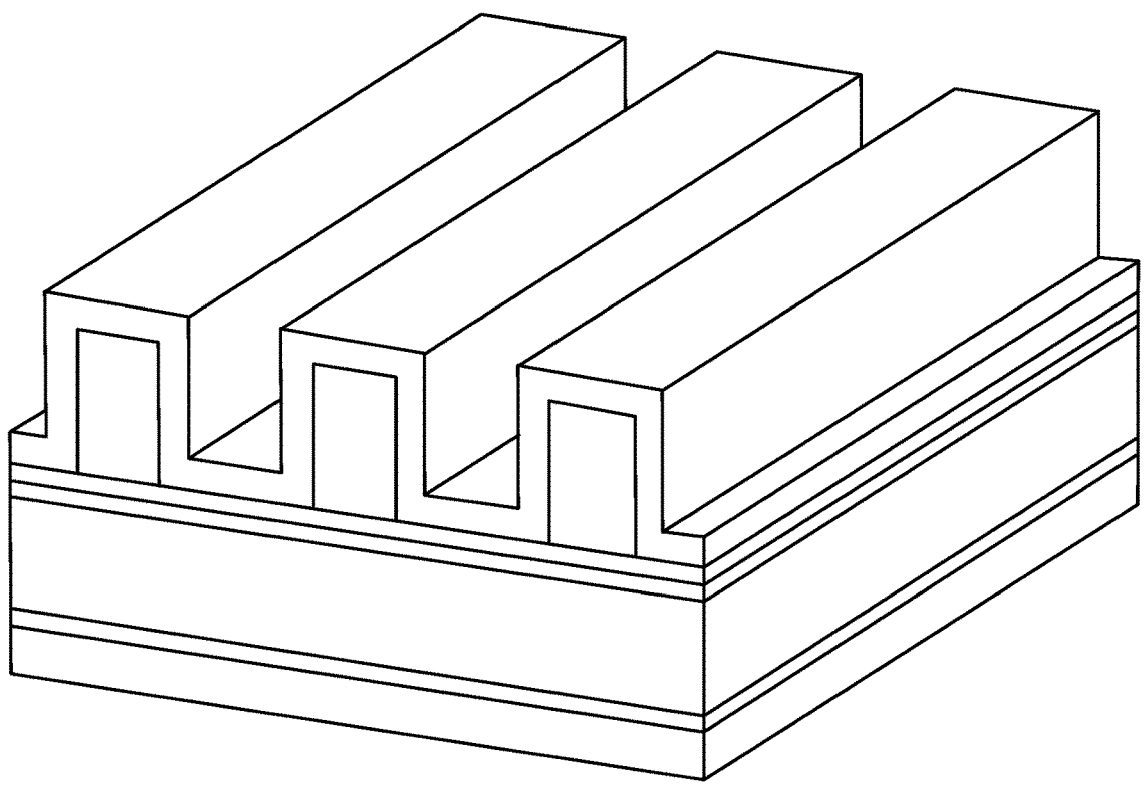
FIGS. 8A-8F show schematic isometric views of a semiconductor substrate undergoing processing according to an embodiment provided herein, illustrating the use of tin oxide spacers as second mandrels in an SAQP process.
Figure 8B:
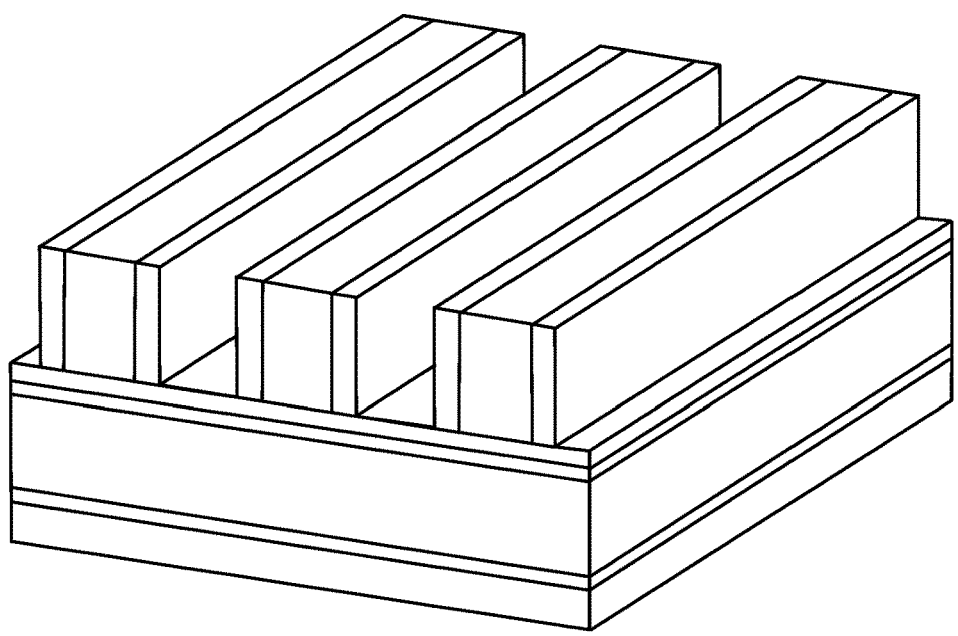
Figure 8C:
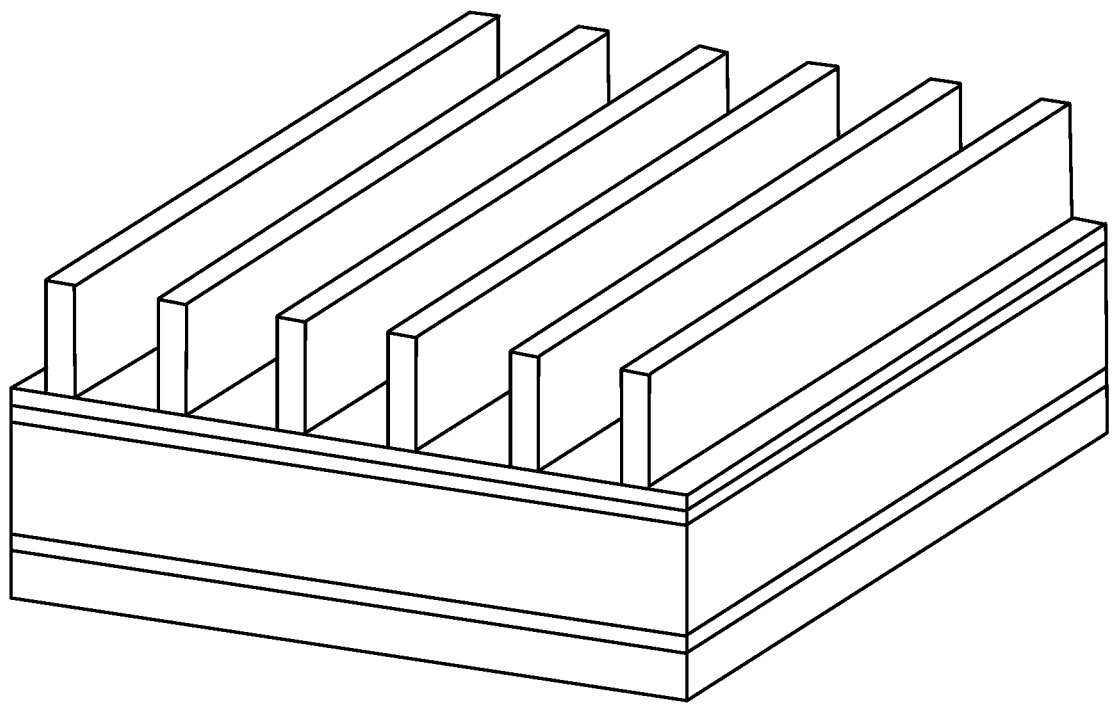

Next, tin oxide is removed from horizontal surfaces without being fully removed from the regions near the mandrel sidewalls, providing a structure shown in FIG. 7C. Isometric view of such structure is shown in FIG. 8B. Tin oxide can be removed selectively relative to photoresist using any of the methods that were described herein. For example tin oxide can be etched from horizontal surfaces using methods that involve hydrogen-based etching at least during a portion of the etch. Passivation can be used in order to provide optimal geometry for the tin oxide spacers. This step exposes the photoresist material. Next, photoresist is selectively removed without fully removing the tin oxide that resided at the sidewalls of the photoresist mandrels. In some embodiments this photoresist mandrel pull is performed by ashing, e.g. using an oxygen-based chemistry. Removal of photoresist mandrels is performed using a chemistry that is selective relative to tin oxide and ESL material, and oxygen-based ashing is a suitable selective method for photoresist removal. The resulting structure is shown in FIG. 7D, where tin oxide protruding features 709 (which can be referred to as both first spacers and second mandrels) reside on the ESL 703, and are spaced apart from each other by defined distances dictated by the dimensions of the first photoresist mandrels. The number of these protruding features is twice the number of the first mandrels. The corresponding isometric view is shown in FIG. 8C.

Figure 7E:
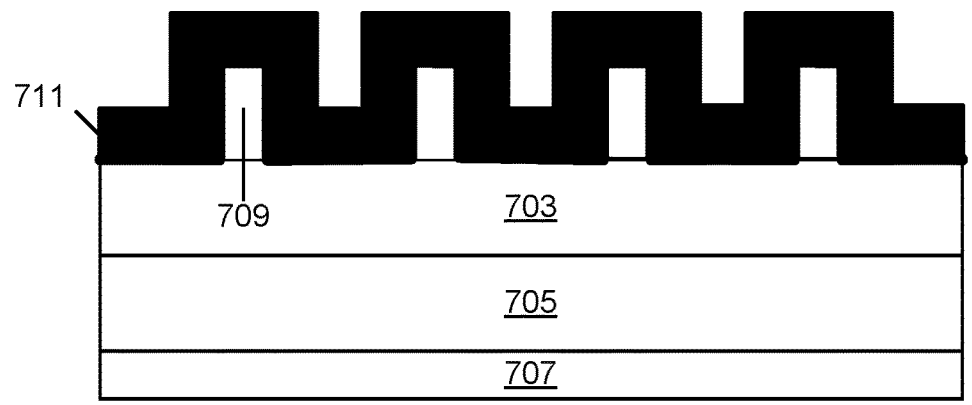
Figure 8D:
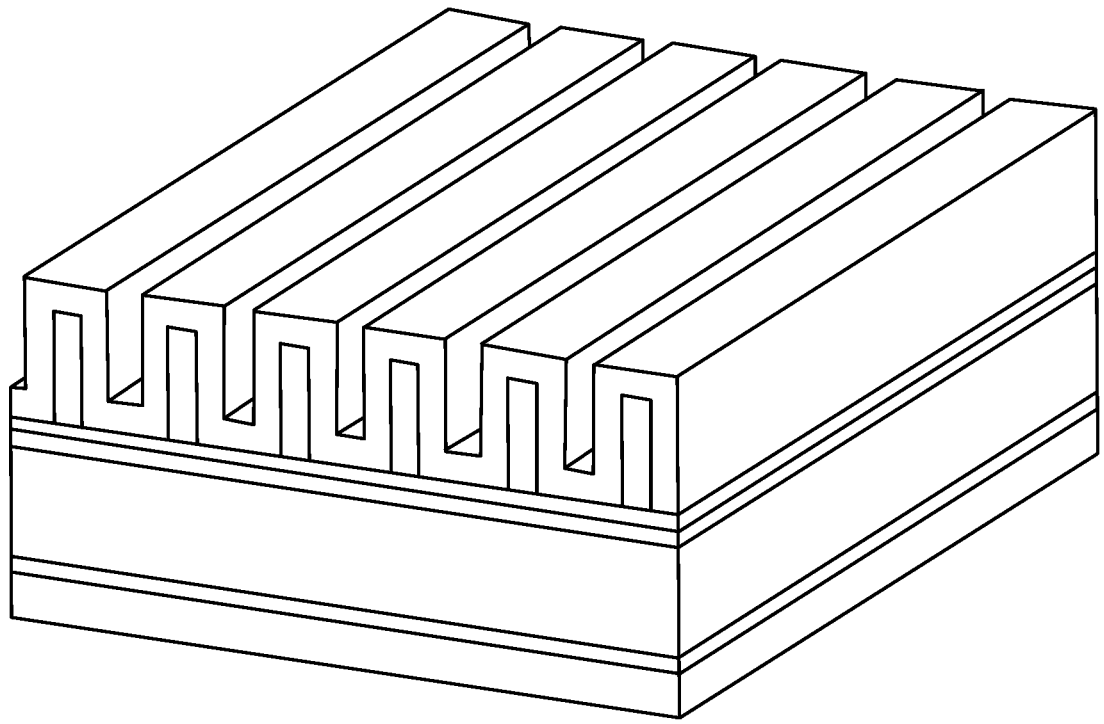

After the tin oxide protruding features have been formed they are used as second mandrels for subsequent patterning. The process involves conformally depositing a second spacer material over the surface of the substrate. In the illustrated embodiment, the second spacer material is a silicon-containing compound that is different from the ESL material. For example, in some implementations the second spacer is silicon oxide and the ESL material is a different material (e.g., silicon carbide). The structure obtained after deposition of the second spacer material is shown in FIG. 7E, where the second spacer material layer 711 (silicon oxide in the illustrated embodiment) is covering the horizontal surfaces of the tin oxide mandrels 709, the sidewalls of tin oxide mandrels and ESL 703. The silicon oxide second spacer layer is deposited, in some embodiments, by a conformal deposition method, such as ALD. The corresponding isometric structure is shown in FIG. 8D.

Figure 7F:
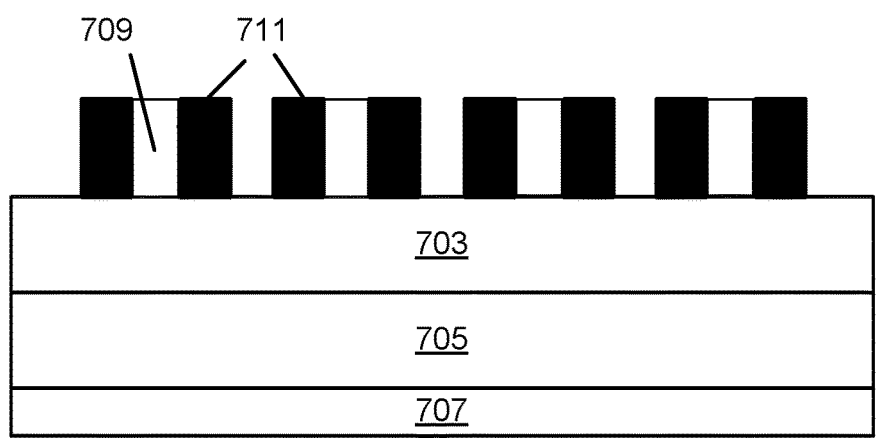
Figure 7G:
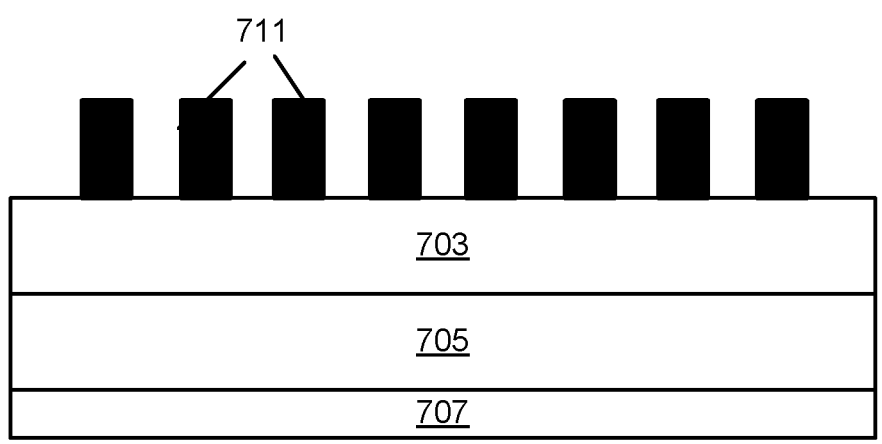
Figure 8E:
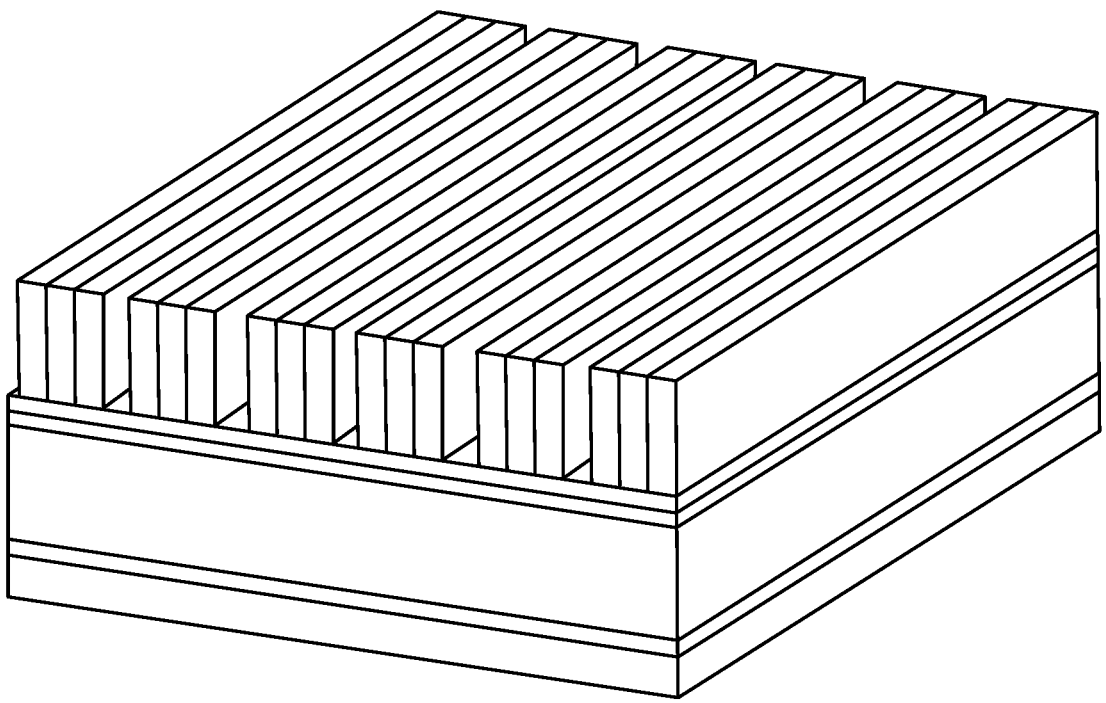
Figure 8F:
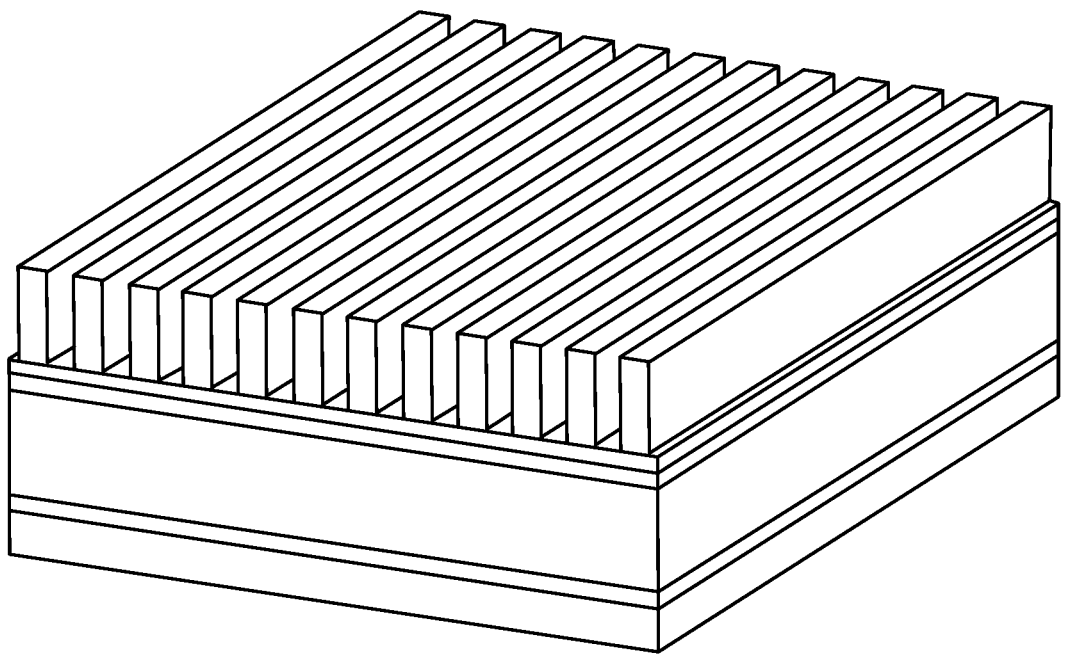

Next, the second spacer material is removed from horizontal surfaces without being fully removed from the regions at the sidewalls of the tin oxide mandrels. This etch is preferably selective relative to tin oxide. In the depicted implementation silicon oxide can be etched using a fluorine-based (e.g., fluorocarbon-based) etch chemistry selectively to tin oxide. The structure obtained after the etch is illustrated in FIG. 7F, where the tin oxide material of the second mandrels 709 is exposed. The corresponding isometric view is shown in FIG. 8E. Next, the second mandrels 709 are removed without fully removing the material of the second spacers that reside at the sidewalls of the second mandrels. This second mandrel pull can be performed using any selective tin oxide etch chemistry described herein. In one implementation the tin oxide second mandrels are selectively removed relative to second spacer (e.g., silicon oxide) material using hydrogen-based etch chemistry. After removal of the tin oxide second mandrels, the substrate contains a plurality of second spacers on the ESL layer. The number of second spacers is twice the number of the second tin oxide mandrels and quadruple the number of first photoresist mandrels. FIG. 7G shows a the spacers 711 on the ESL 703. The corresponding isometric view is shown in FIG. 8F. The process may further follow by etching underlying layers 703 and 705, at positions that are not protected by the spacers, similarly to any spacer or hardmask process sequences provided herein (e.g., as described with reference to FIGS. 1D-1F). The second spacers are then removed after or during patterning of the underlying layers.

The illustrated sequence can provide the following processing benefits. First, tin oxide can be etched to obtain a squared spacer (which doubles as second mandrel) with minimal footing and no spacer critical dimension (CD) loss if in-situ sidewall passivation using $SiO_2$ is used. The squared tin oxide spacer with minimal footing meets the requirements as the second mandrel for the second spacer deposition. When the second spacer is a silicon-containing material (e.g., $SiO_2$) it can be etched using fluorine-based chemistry with high selectivity versus tin oxide. The tin oxide spacer/mandrel can be removed using $H_2$ chemistry which has high etch selectivity to silicon oxide or other silicon-containing compounds (which can be used as second spacer materials).

Other Oxides as Mandrels.

In some embodiments other oxide materials are used in lieu of tin oxide in any of the processing sequences described herein. Specifically, oxides of elements that form hydrides having high vapor pressure can be used. Oxides of elements that form volatile hydrides (e.g., hydrides with boiling points less than about 20° C., such as less than about 0° C.) where the hydrides are stable and gaseous at processing temperatures, are used. For example, in some implementations, antimony oxide or tellurium oxide can be used in place of tin oxide in any of the process sequences described herein, and are etched using similar hydrogen-based chemistries, during processing.

Apparatus

The methods described herein can be carried out in a variety of apparatuses configured for etching and deposition. A suitable apparatus configured for etching includes an etch process chamber, a substrate holder in the etch process chamber configured to hold the substrate in place during etching, and a plasma generating mechanism configured for generating a plasma in a process gas.

Examples of suitable apparatuses include inductively coupled plasma (ICP) reactors which, in certain embodiments, may also be suitable for cyclic deposition and activation processes, including atomic layer etching (ALE) operations and atomic layer deposition (ALD) operations. Although ICP reactors are described herein in detail, it should be understood that capacitively coupled plasma reactors may also be used.

Figure 9:
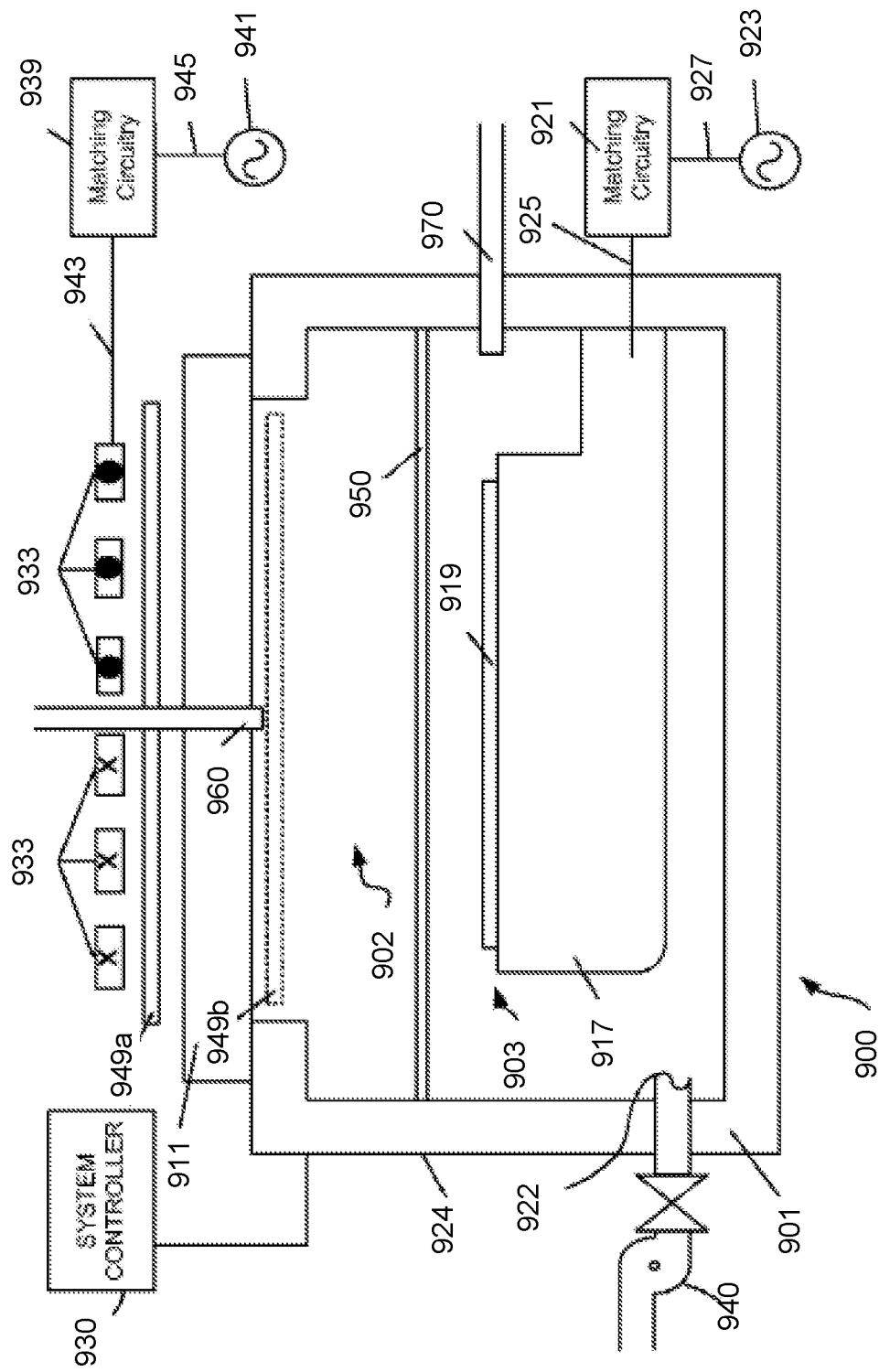
FIG. 9 is a schematic presentation of an apparatus that is suitable for etching tin oxide using etch chemistries provided herein.

FIG. 9 schematically shows a cross-sectional view of an inductively coupled plasma integrated etching and deposition apparatus 900 appropriate for implementing plasma etching described herein, an example of which is a Kiyo® reactor, produced by Lam Research Corp. of Fremont, CA. The inductively coupled plasma apparatus 900 includes an overall process chamber 924 structurally defined by chamber walls 901 and a window 911. The chamber walls 901 may be fabricated from stainless steel or aluminum. The window 911 may be fabricated from quartz or other dielectric material. An optional internal plasma grid 950 divides the overall process chamber into an upper sub-chamber 902 and a lower sub-chamber 903. In most embodiments, plasma grid 950 may be removed, thereby utilizing a chamber space made of sub-chambers 902 and 903. A chuck 917 is positioned within the lower sub-chamber 903 near the bottom inner surface. The chuck 917 is configured to receive and hold a semiconductor wafer 919 upon which the etching and deposition processes are performed. The chuck 917 can be an electrostatic chuck for supporting the wafer 919 when present. In some embodiments, an edge ring (not shown) surrounds chuck 917, and has an upper surface that is approximately planar with a top surface of the wafer 919, when present over chuck 917. The chuck 917 also includes electrostatic electrodes for chucking and dechucking the wafer 919. A filter and DC clamp power supply (not shown) may be provided for this purpose. Other control systems for lifting the wafer 919 off the chuck 917 can also be provided. The chuck 917 can be electrically charged using an RF power supply 923. The RF power supply 923 is connected to matching circuitry 921 through a connection 927. The matching circuitry 921 is connected to the chuck 917 through a connection 925. In this manner, the RF power supply 923 is connected to the chuck 917. In various embodiments, a bias power of the electrostatic chuck may be set at about 50 Vb or may be set at a different bias power depending on the process performed in accordance with disclosed embodiments. For example, the bias power may be between about 20 Vb and about 100 Vb, or between about 30 Vb and about 150 Vb.

Elements for plasma generation include a coil 933 is positioned above window 911. In some embodiments, a coil is not used in disclosed embodiments. The coil 933 is fabricated from an electrically conductive material and includes at least one complete turn. The example of a coil 933 shown in FIG. 9 includes three turns. The cross-sections of coil 933 are shown with symbols, and coils having an "X" extend rotationally into the page, while coils having a "●" extend rotationally out of the page. Elements for plasma generation also include an RF power supply 941 configured to supply RF power to the coil 933. In general, the RF power supply 941 is connected to matching circuitry 939 through a connection 945. The matching circuitry 939 is connected to the coil 933 through a connection 943. In this manner, the RF power supply 941 is connected to the coil 933. An optional Faraday shield 949a is positioned between the coil 933 and the window 911. The Faraday shield 949a may be maintained in a spaced apart relationship relative to the coil 933. In some embodiments, the Faraday shield 949a is disposed immediately above the window 911. In some embodiments, the Faraday shield 949b is between the window 911 and the chuck 917. In some embodiments, the Faraday shield 949b is not maintained in a spaced apart relationship relative to the coil 933. For example, the Faraday shield 949b may be directly below the window 911 without a gap. The coil 933, the Faraday shield 949a, and the window 911 are each configured to be substantially parallel to one another. The Faraday shield 949a may prevent metal or other species from depositing on the window 911 of the process chamber 924.

Process gas (e.g. $H_2$ and He, etc.) may be flowed into the process chamber through one or more main gas flow inlets 960 positioned in the upper sub-chamber 902 and/or through one or more side gas flow inlets 970. Likewise, though not explicitly shown, similar gas flow inlets may be used to supply process gases to a capacitively coupled plasma processing chamber. A vacuum pump, e.g., a one or two stage mechanical dry pump and/or turbomolecular pump 940, may be used to draw process gases out of the process chamber 924 and to maintain a pressure within the process chamber 924. For example, the vacuum pump may be used to evacuate the lower sub-chamber 903 during a purge operation of. A valve-controlled conduit may be used to fluidically connect the vacuum pump to the process chamber 924 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 900, one or more process gases such as an $H_2$-containing gas for hydrogen-based etching, may be supplied through the gas flow inlets 960 and/or 970. In certain embodiments, process gas may be supplied only through the main gas flow inlet 960, or only through the side gas flow inlet 970. In some cases, the gas flow inlets shown in the figure may be replaced by more complex gas flow inlets, one or more showerheads, for example. The Faraday shield 949a and/or optional grid 950 may include internal channels and holes that allow delivery of process gases to the process chamber 924. Either or both of Faraday shield 949a and optional grid 950 may serve as a showerhead for delivery of process gases. In some embodiments, a liquid vaporization and delivery system may be situated upstream of the process chamber 924, such that once a liquid reactant or precursor is vaporized, the vaporized reactant or precursor is introduced into the process chamber 924 via a gas flow inlet 960 and/or 970.

Radio frequency power is supplied from the RF power supply 941 to the coil 933 to cause an RF current to flow through the coil 933. The RF current flowing through the coil 933 generates an electromagnetic field about the coil 933. The electromagnetic field generates an inductive current within the upper sub-chamber 902. The physical and chemical interactions of various generated ions and radicals with the wafer 919 etch features of and selectively deposit layers on the wafer 919.

If the plasma grid 950 is used such that there is both an upper sub-chamber 902 and a lower sub-chamber 903, the inductive current acts on the gas present in the upper sub-chamber 902 to generate an electron-ion plasma in the upper sub-chamber 902. The optional internal plasma grid 950 limits the amount of hot electrons in the lower sub-chamber 903. In some embodiments, the apparatus 900 is designed and operated such that the plasma present in the lower sub-chamber 903 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 903 through port 922. For example, tin hydride generated during etching of tin oxide using $H_2$ plasma can be removed through port 922 during purging and/or evacuation. The chuck 917 disclosed herein may operate at elevated temperatures ranging between about 10° C. and about 250° C. The temperature will depend on the process operation and specific recipe. In some embodiments the apparatus is controlled to conduct the etching at a temperature of less than about 100° C.

Apparatus 900 may be coupled to facilities (not shown) when installed in a clean room or a fabrication facility. Facilities include plumbing that provide processing gases, vacuum, temperature control, and environmental particle control. These facilities are coupled to apparatus 900, when installed in the target fabrication facility. Additionally, apparatus 900 may be coupled to a transfer chamber that allows robotics to transfer semiconductor wafers into and out of apparatus 900 using typical automation.

In some embodiments, a system controller 930 (which may include one or more physical or logical controllers) controls some or all of the operations of a process chamber 924. The system controller 930 may include one or more memory devices and one or more processors. In some embodiments, the apparatus 900 includes a switching system for controlling flow rates of the process gases. The controller, in some embodiments, includes program instructions for causing the steps of any of the methods provided herein.

In some implementations, the system controller 930 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 930, which may control various components or subparts of the system or systems. The system controller, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 930 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 930, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 930 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 930 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 10:
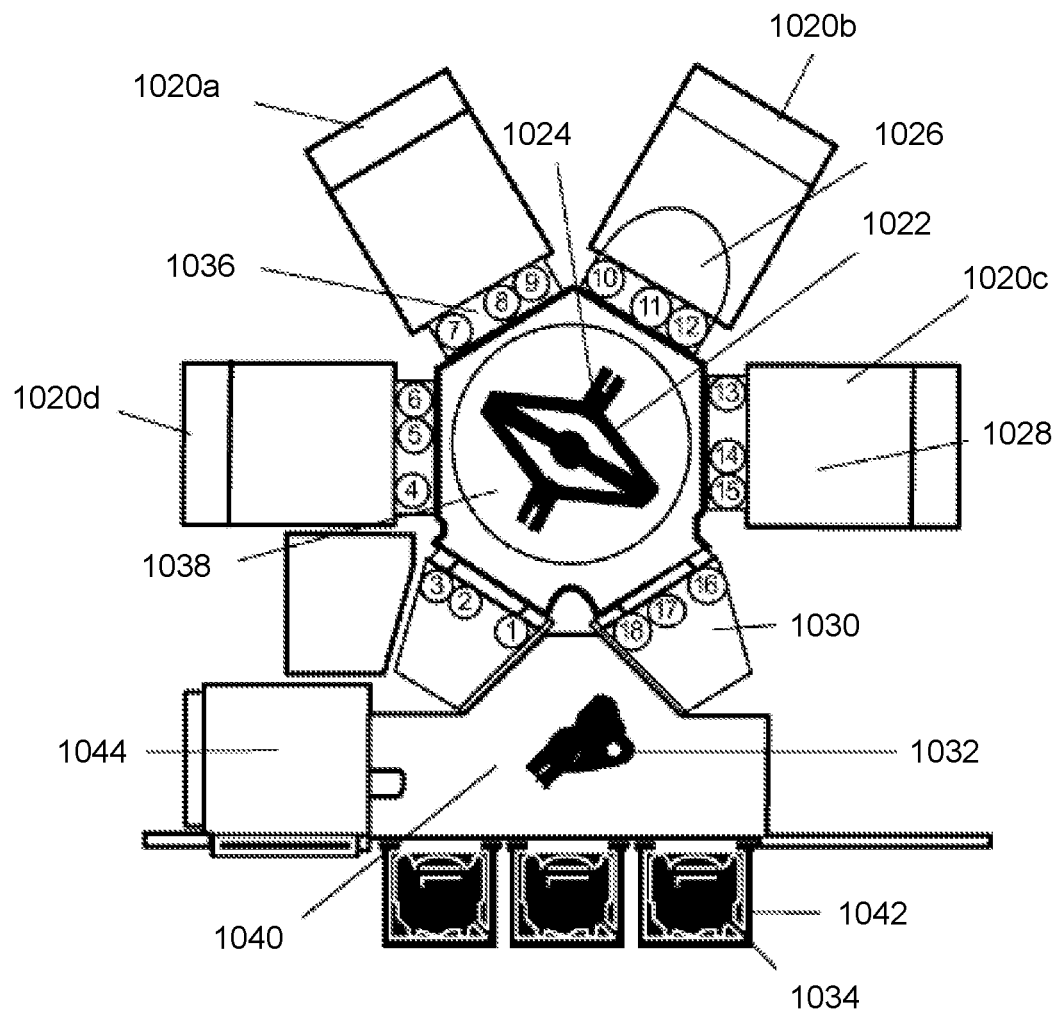
FIG. 10 shows a schematic view of a multi-station processing system according to an embodiment provided herein.

FIG. 10 depicts a semiconductor process cluster architecture with various modules that interface with a vacuum transfer module 1038 (VTM). The arrangement of various modules to "transfer" wafers among multiple storage facilities and processing modules may be referred to as a "cluster tool architecture" system. Airlock 1030, also known as a loadlock or transfer module, interfaces with the VTM 1038 which, in turn, interfaces with four processing modules 1020a-1020d, which may be individual optimized to perform various fabrication processes. By way of example, processing modules 1020a-1020d may be implemented to perform substrate etching, deposition, ion implantation, wafer cleaning, sputtering, and/or other semiconductor processes. In some embodiments, tin oxide deposition and tin oxide etching are performed in the same module. In some embodiments, tin oxide deposition and tin oxide etching are performed in different modules of the same tool. One or more of the substrate etching processing modules (any of 1020a-1020d) may be implemented as disclosed herein, e.g., for depositing conformal films, selectively etching tin oxide, forming air gaps, and other suitable functions in accordance with the disclosed embodiments. Airlock 1030 and processing modules 1020a-1020d may be referred to as "stations." Each station has a facet 1036 that interfaces the station to VTM 1038. Inside each facet, sensors 1-18 are used to detect the passing of wafer 1026 when moved between respective stations.

Robot 1022 transfers wafer 1026 between stations. In one embodiment, robot 1022 has one arm, and in another embodiment, robot 1022 has two arms, where each arm has an end effector 1024 to pick wafers such as wafer 1026 for transport. Front-end robot 1032, in atmospheric transfer module (ATM) 1040, is used to transfer wafers 1026 from cassette or Front Opening Unified Pod (FOUP) 1034 in Load Port Module (LPM) 1042 to airlock 1030. Module center 1028 inside processing modules 1020a-1020d is one location for placing wafer 1026. Aligner 1044 in ATM 1040 is used to align wafers.

In an exemplary processing method, a wafer is placed in one of the FOUPs 1034 in the LPM 1042. Front-end robot 1032 transfers the wafer from the FOUP 1034 to an aligner 1044, which allows the wafer 1026 to be properly centered before it is etched or processed. After being aligned, the wafer 1026 is moved by the front-end robot 1032 into an airlock 1030. Because the airlock 1030 has the ability to match the environment between an ATM 1040 and a VTM 1038, the wafer 1026 is able to move between the two pressure environments without being damaged. From the airlock 1030, the wafer 1026 is moved by robot 1022 through VTM 1038 and into one of the processing modules 1020a-1020d. In order to achieve this wafer movement, the robot 1022 uses end effectors 1024 on each of its arms. Once the wafer 1026 has been processed, it is moved by robot 1022 from the processing modules 1020a-1020d to the airlock 1030. From here, the wafer 1026 may be moved by the front-end robot 1032 to one of the FOUPs 1034 or to the aligner 1044.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 9 may be implemented with the tool in FIG. 10. Machine-readable media containing instructions for controlling process operations in accordance with the present invention may be coupled to the system controller.

In some embodiments, a system for processing a semiconductor substrate includes one or more deposition chambers; one or more etch chambers; and a system controller having program instructions for conducting any of the processes or sub-processes described herein. In some embodiments program instructions are included for causing the operations of: on the semiconductor substrate having a plurality of tin oxide protruding features, causing a deposition of a spacer material on both the horizontal surfaces and the sidewalls of the tin oxide protruding features; and causing a removal of the spacer material from the horizontal surfaces of the tin oxide protruding features to expose an underlying tin oxide, without causing a complete removal of the spacer material at the sidewalls of the tin oxide protruding features. The controller may further include program instructions for: causing a removal of the tin oxide protruding features without causing a complete removal of the spacer material that has previously resided at the sidewalls of the tin oxide protruding features, to thereby form a plurality of spacers on the semiconductor substrate. In some embodiments the controller includes program instructions for: causing the formation of the semiconductor substrate having a plurality of tin oxide protruding features by causing a deposition of a conformal tin oxide layer over a semiconductor substrate having a plurality of first mandrels, followed by removal of the tin oxide material from horizontal surfaces and by removal of the first mandrels.

In some embodiments, an etching apparatus is provided that includes an etching process chamber having an inlet for a process gas; a substrate holder configured for holding a semiconductor substrate in the etching process chamber; and a process controller comprising program instructions for any of the processes and sub-processes provided herein. In some embodiments the controller includes program instructions for causing etching of a layer of a spacer material that coats tin oxide protruding features on the semiconductor substrate such that the spacer material is completely removed from the horizontal surfaces of the semiconductor substrate without being completely removed at the sidewalls of the plurality of tin oxide protruding features.

In another aspect a non-transitory computer machine-readable medium is provided, where it includes code for causing the performance of any of the methods described herein.

Further Implementations

The apparatus and processes described herein may be used in conjunction with lithographic patterning tools or processes, for example, for the fabrication or manufacture of semiconductor devices, displays, LEDs, photovoltaic panels, and the like. Typically, though not necessarily, such apparatus and processes will be used or conducted together in a common fabrication facility. Lithographic patterning of a film typically comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper. In some embodiments, a system including any of the apparatuses described herein and a stepper is provided.

What is claimed is:

1. An etching apparatus comprising:
   (a) an etching process chamber having an inlet for a process gas;
   (b) a substrate holder configured for holding a semiconductor substrate in the etching process chamber; and
   (c) a process controller comprising program instructions for:
   (i) on the semiconductor substrate comprising a patterned photoresist layer overlying a tin oxide layer, and an intermediate layer comprising at least one of a silicon-containing material and a carbon-containing material, causing an etching of the intermediate layer to transfer a pattern of the patterned photoresist layer to the intermediate layer, followed by causing an etching of a plurality of openings in the tin oxide layer, wherein etching the plurality of openings in the tin oxide layer comprises etching the tin oxide layer using at least one of a hydrogen-based etch chemistry and a chlorine-based etch chemistry;
   (ii) causing photoresist layer removal using an oxygen-based chemistry;
   (iii) causing an intermediate layer removal to form a plurality of tin oxide protruding features on the substrate; and
   (iv) causing an etching of a layer of a spacer material coating the plurality of tin oxide protruding features and an etch stop layer material, on the semiconductor substrate such that the spacer material is completely removed from the horizontal surfaces of the semiconductor substrate without being completely removed at the sidewalls of the plurality of tin oxide protruding features using a spacer material etch chemistry having an etch selectivity of greater than 1 for the spacer material relative to tin oxide, wherein the spacer material etch chemistry further has a selectivity of greater than 1 for the spacer material relative to the etch stop layer material, and wherein the etch stop layer material is different from both tin oxide and the spacer material.

2. The etching apparatus of claim 1, wherein the spacer material is a silicon-containing material and the spacer material etch chemistry is a fluorine-based chemistry.

3. The etching apparatus of claim 2, wherein the fluorine-based chemistry is a fluorocarbon-based chemistry and wherein the program instructions in (c) comprise program instructions for causing formation of a plasma in a gas comprising a fluorocarbon to etch the silicon-containing spacer material from the horizontal surfaces of the semiconductor substrate.

4. The etching apparatus of claim 1, wherein the spacer material is selected from the group consisting of silicon oxide, silicon nitride, silicon carbide, SiOC, SiNO, SiCNO, and SiCN.

5. The etching apparatus of claim 1, wherein the spacer material is titanium dioxide.

6. The etching apparatus of claim 5, wherein the spacer material etch chemistry is a chlorine-based etch chemistry.

7. The etching apparatus of claim 1, wherein the program instructions further comprise program instructions for causing removal of the plurality of the tin oxide protruding features without causing complete removal of spacer material that resided at the sidewalls of the plurality of the tin oxide protruding features.

8. The etching apparatus of claim 1, wherein the program instructions further comprise program instructions for causing removal of the plurality of the tin oxide protruding features without causing complete removal of spacer material that resided at the sidewalls of the plurality of the tin oxide protruding features by exposing the semiconductor substrate to a hydrogen-based etch chemistry that results in a formation of a tin hydride.

9. The etching apparatus of claim 1, wherein the program instructions further comprise program instructions for causing removal of the plurality of the tin oxide protruding features without causing complete removal of the spacer material that has previously resided at the sidewalls of the plurality of the tin oxide protruding features, thereby forming a plurality of spacers residing over the etch stop layer material, wherein causing removal of the plurality of the tin oxide protruding features comprises causing contacting of the semiconductor substrate with a plasma-activated hydrogen-containing reactant selected from the group consisting of H2, HBr, NH$_3$, H$_2$O, a hydrocarbon, and combinations thereof.

10. The etching apparatus of claim 9, wherein the spacer material is a silicon-containing material.

11. The etching apparatus of claim 9, wherein the spacer material is titanium dioxide.

12. The etching apparatus of claim 1, wherein the apparatus is configured for generating a plasma in a process gas.

13. The etching apparatus of claim 1, wherein the spacer material is a silicon-containing material, and the spacer material etch chemistry is a fluorine-based chemistry, wherein the program instructions further comprise program instructions for causing removal of the plurality of the tin oxide protruding features without causing complete removal of the spacer material that has previously resided at the sidewalls of the plurality of the tin oxide protruding features, thereby forming a plurality of spacers residing over the etch stop layer material, wherein causing removal of the plurality of the tin oxide protruding features comprises causing contacting of the semiconductor substrate with a tin oxide etch chemistry comprising plasma-activated hydrogen- containing reactant selected from the group consisting of $H_2$, $NH_3$, a hydrocarbon, and combinations thereof, wherein the tin oxide etch chemistry has an etch selectivity of greater than 1 for tin oxide relative to the silicon-containing spacer material.

14. An etching apparatus comprising:
  (a) an etching process chamber having an inlet for a process gas;
  (b) a substrate holder configured for holding a semiconductor substrate in the etching process chamber; and
  (c) a process controller comprising program instructions for:
  (i) on the semiconductor substrate comprising a plurality of first protruding features having a tin oxide layer coating the sidewalls of the plurality of first protruding features, etching and removing the plurality of first protruding features without completely removing the tin oxide layer that resided at the sidewalls of the plurality of the first protruding features to thereby form a plurality of tin oxide protruding features; and
  (ii) after formation of the plurality of tin oxide protruding features, and after deposition of a layer of a spacer material to coat the plurality of tin oxide protruding features, causing an etching of the layer of the spacer material coating the plurality of tin oxide protruding features and an etch stop layer material, on the semiconductor substrate such that the spacer material is completely removed from the horizontal surfaces of the semiconductor substrate without being completely removed at the sidewalls of the plurality of tin oxide protruding features using a spacer material etch chemistry having an etch selectivity of greater than 1 for the spacer material relative to tin oxide, wherein the spacer material etch chemistry further has a selectivity of greater than 1 for the spacer material relative to the etch stop layer material, and wherein the etch stop layer material is different from both tin oxide and the spacer material.

15. The etching apparatus of claim 14, wherein the plurality of first protruding features having a tin oxide layer coating the sidewalls of the plurality of first protruding features are photoresist protruding features.

* * * * *